United States Patent
Pu et al.

(10) Patent No.: US 6,273,022 B1
(45) Date of Patent: *Aug. 14, 2001

(54) DISTRIBUTED INDUCTIVELY-COUPLED PLASMA SOURCE

(75) Inventors: Bryan Y. Pu; Hongching Shan, both of San Jose; Claes Bjorkman, Mountain View; Kenny Doan, San Jose; Mike Welch, Livermore; Richard Raymond Mett, Santa Clara, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/039,216
(22) Filed: Mar. 14, 1998

(51) Int. Cl.[7] ................................................. C23C 16/507
(52) U.S. Cl. .............. 118/723 I; 156/345; 118/723 MA; 118/723 MR; 216/68
(58) Field of Search .............................. 438/725; 315/248, 315/57; 156/345; 118/223 MA; 216/68; 505/1; 75/11

(56) References Cited

U.S. PATENT DOCUMENTS

| | | | |
|---|---|---|---|
| 3,521,120 | * | 7/1970 | Anderson .............................. 315/57 |
| 4,245,179 | * | 1/1981 | Buhrer ................................. 315/248 |
| 4,494,984 | * | 1/1985 | Calderon ................................. 75/11 |

(List continued on next page.)

FOREIGN PATENT DOCUMENTS

| | | |
|---|---|---|
| 8-195296 | 7/1996 | (JP) . |
| 97/16946 | 5/1997 | (WO) . |

OTHER PUBLICATIONS

Tynan, G.R., et al., "Characterization of an azimuthally symmetric helicon wave high density plasma source", J. Vac. Sci. Technol. A 15(6), Nov. 1997.*

Kamenski, I.V., et al., "An evaluation of different antenna designs for helicon wave excitation in a cylindrical plasma source", Physics of Plasmas, 3(12), pp. 4396–4409, Dec. 1996.*

Light, M., et al "Helicon wave excitation with helical antennas", Physics of Plasmas, 2(4), pp. 1084–1093, Apr. 1995.*

*Primary Examiner*—Gregory Mills
*Assistant Examiner*—Rudy Zervigon
(74) *Attorney, Agent, or Firm*—Robert Stern

(57) ABSTRACT

Apparatus and method for inductively coupling electrical power to a plasma in a semiconductor process chamber. In a first aspect, an array of induction coils is distributed over a geometric surface having a circular transverse section. Each coil has a transverse section which is wedge-shaped so that the adjacent sides of any two adjacent coils in the array are approximately parallel to a radius of the circular transverse section of the geometric surface. The sides of adjacent coils being parallel enhances the radial uniformity of the magnetic field produced by the coil array. In a second aspect, electrostatic coupling between the induction coils and the plasma is minimized by connecting each induction coil to the power supply so that the turn of wire of the coil which is nearest to the plasma is near electrical ground potential. In one embodiment, the near end of each coil connects directly to electrical ground. In second and third embodiments, two coils are connected in series at the near end of each coil. In the second embodiment, the opposite ("RF hot") end of each coil is connected to a respective balanced output of an RF power supply. In the third embodiment, the hot end of one coil is connected to the unbalanced output of an RF power supply, and the hot end of the other coil is connected to electrical ground through a capacitor which resonates with the latter coil at the frequency of the RF power supply.

42 Claims, 9 Drawing Sheets

U.S. PATENT DOCUMENTS

| | | | |
|---|---|---|---|
| 5,004,724 | * 4/1991 | De | 505/1 |
| 5,139,236 | * 8/1992 | Mankins | 266/78 |
| 5,304,279 | * 4/1994 | Coultas et al. | 156/345 |
| 5,435,881 | * 7/1995 | Ogle | 156/345 |
| 5,464,476 | 11/1995 | Gibb et al. | 118/723 MP |
| 5,505,780 | * 4/1996 | Dalvie et al. | 118/723 MA |
| 5,683,548 | 11/1997 | Hartig et al. | 438/729 |
| 5,811,022 | * 9/1998 | Savas et al. | 216/68 |
| 5,824,604 | * 10/1998 | Bar-Gadda | 438/725 |
| 5,874,704 | 2/1999 | Gates | 219/121.43 |
| 5,891,350 | 4/1999 | Shan et al. | 216/71 |

\* cited by examiner

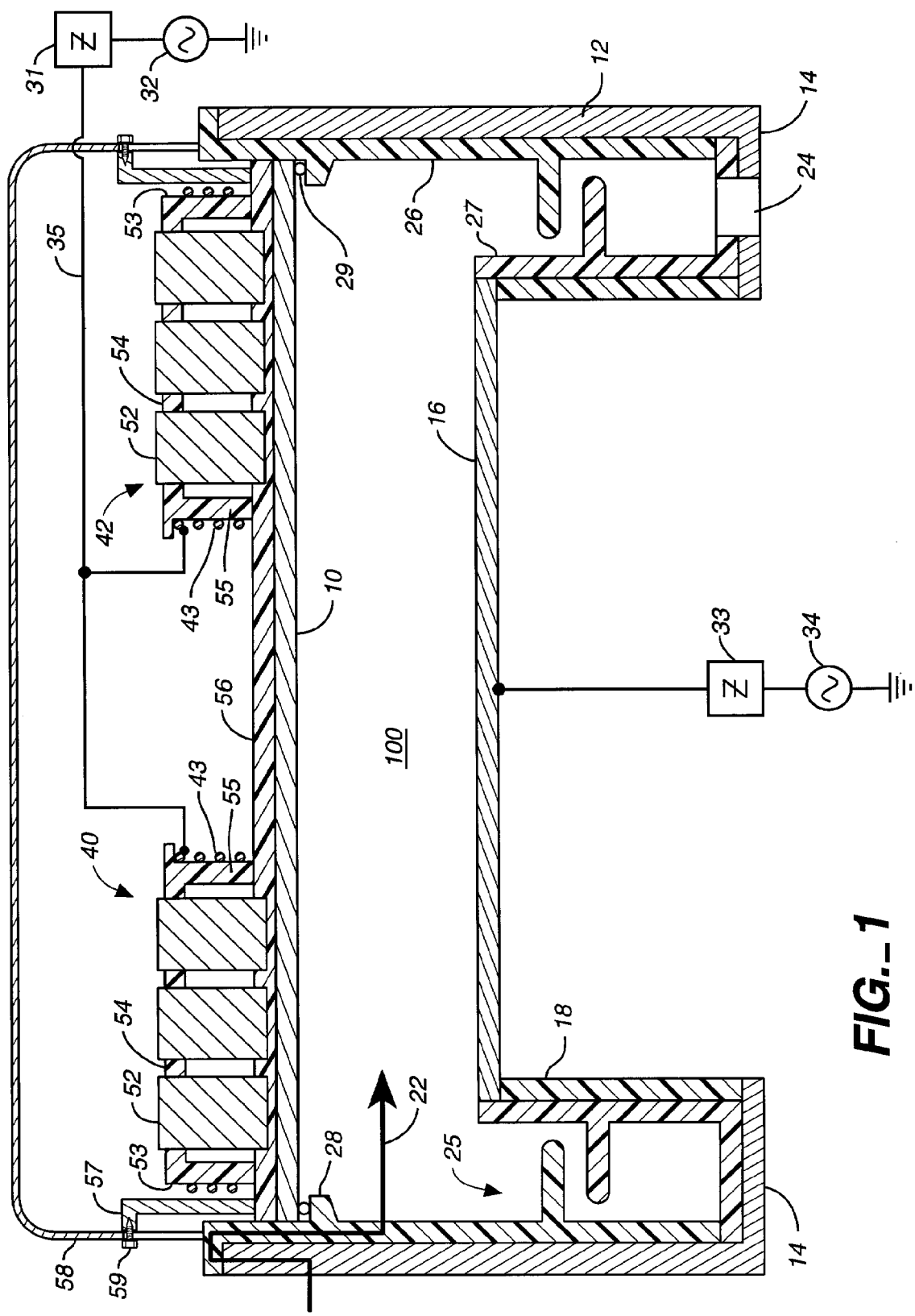
FIG._1

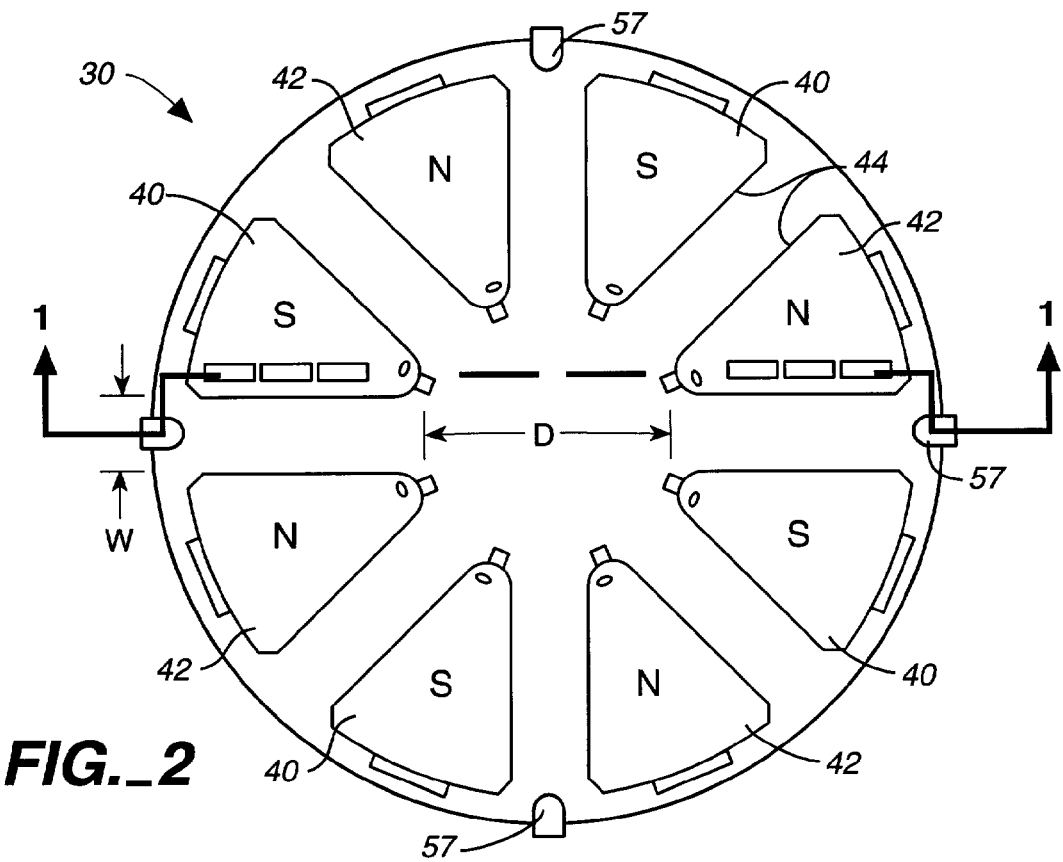
FIG._2
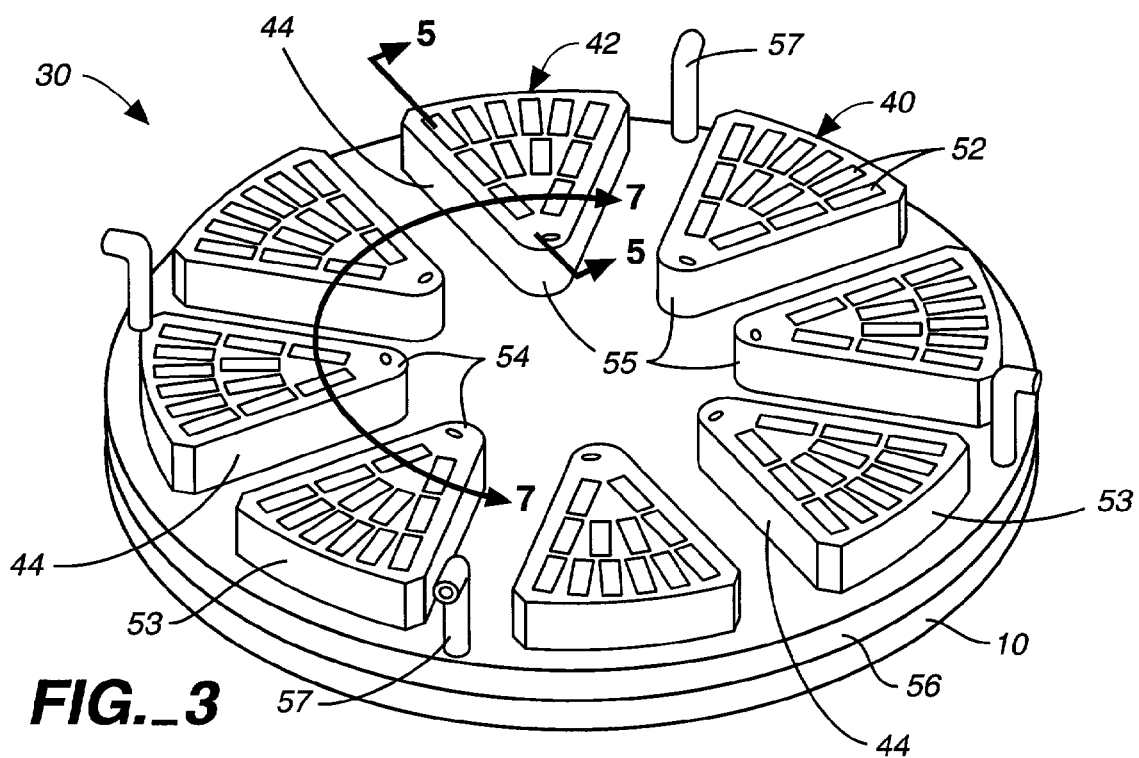
FIG._3

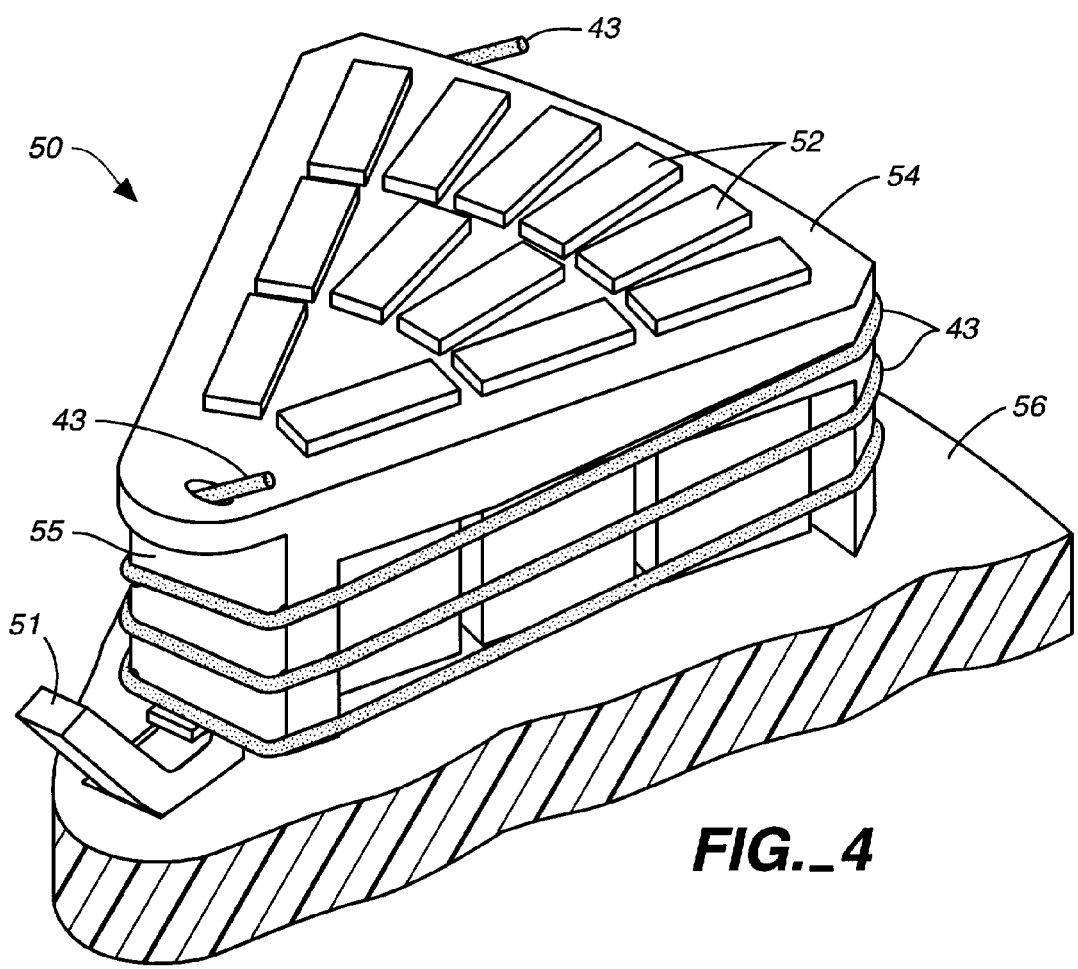
FIG._4
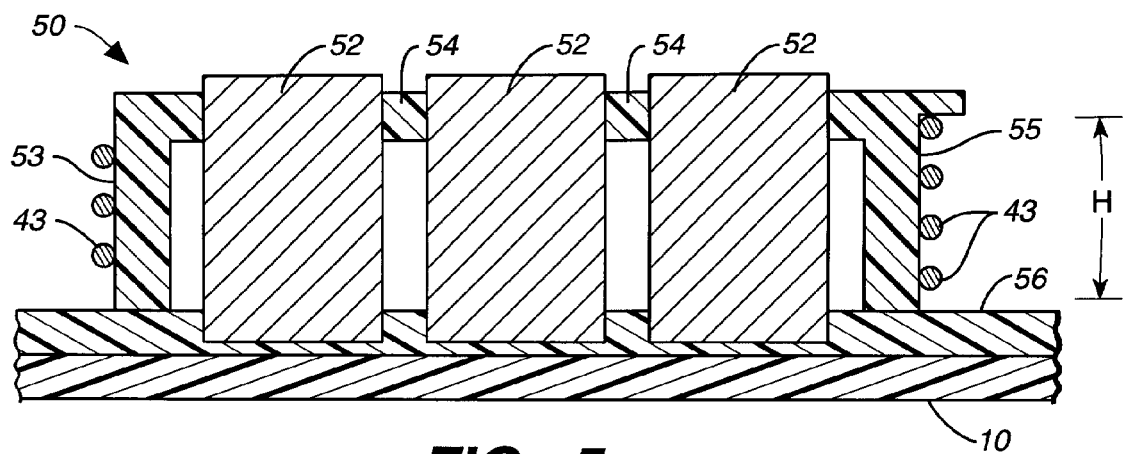
FIG._5

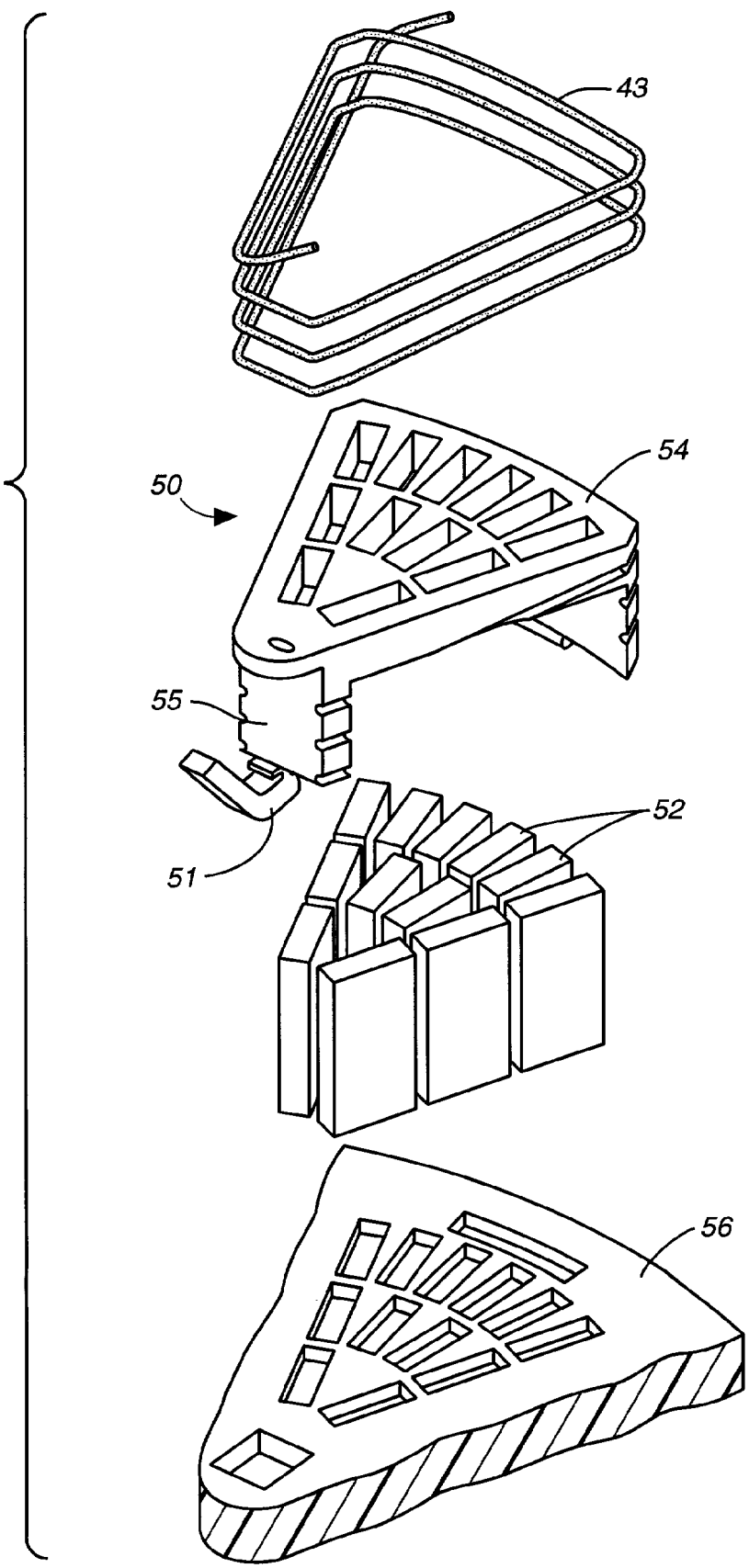
FIG._6

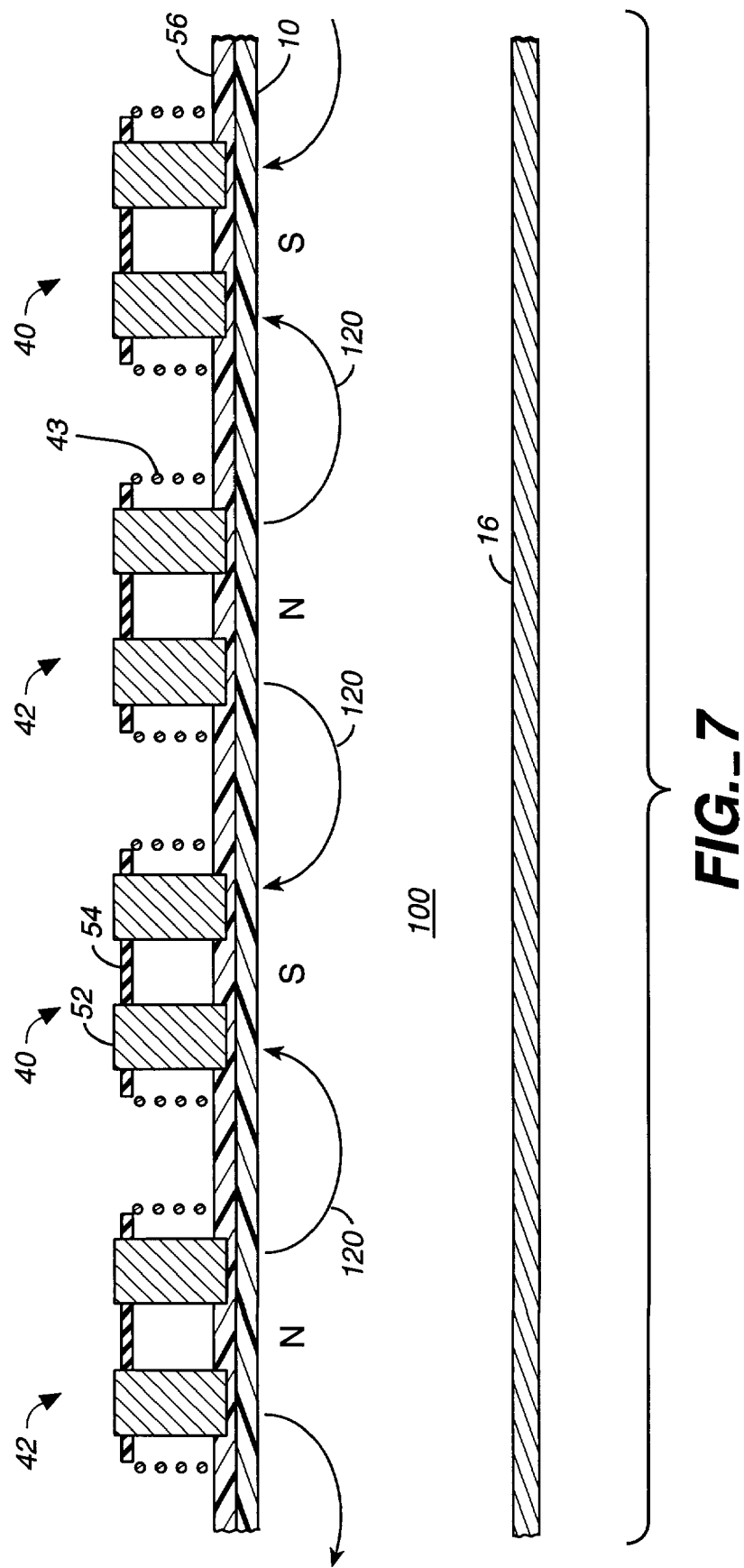
FIG._7

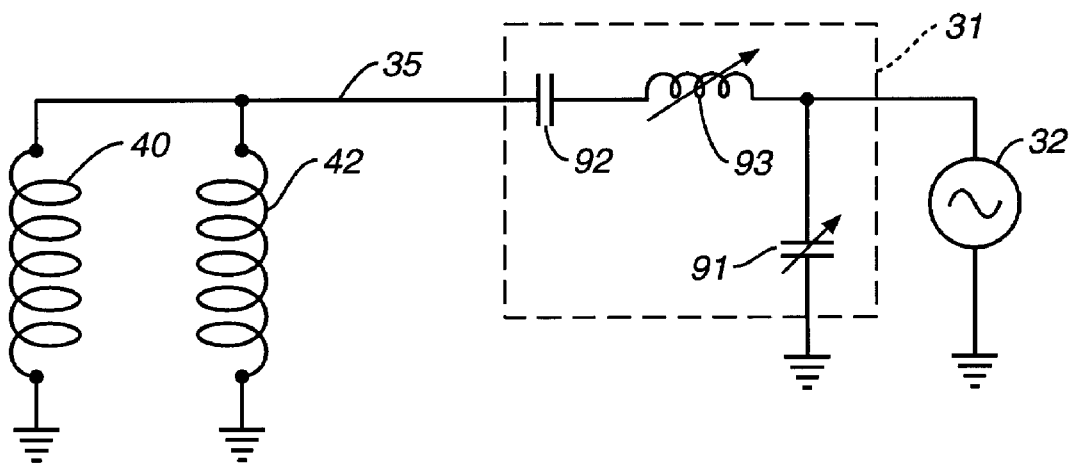
FIG._8
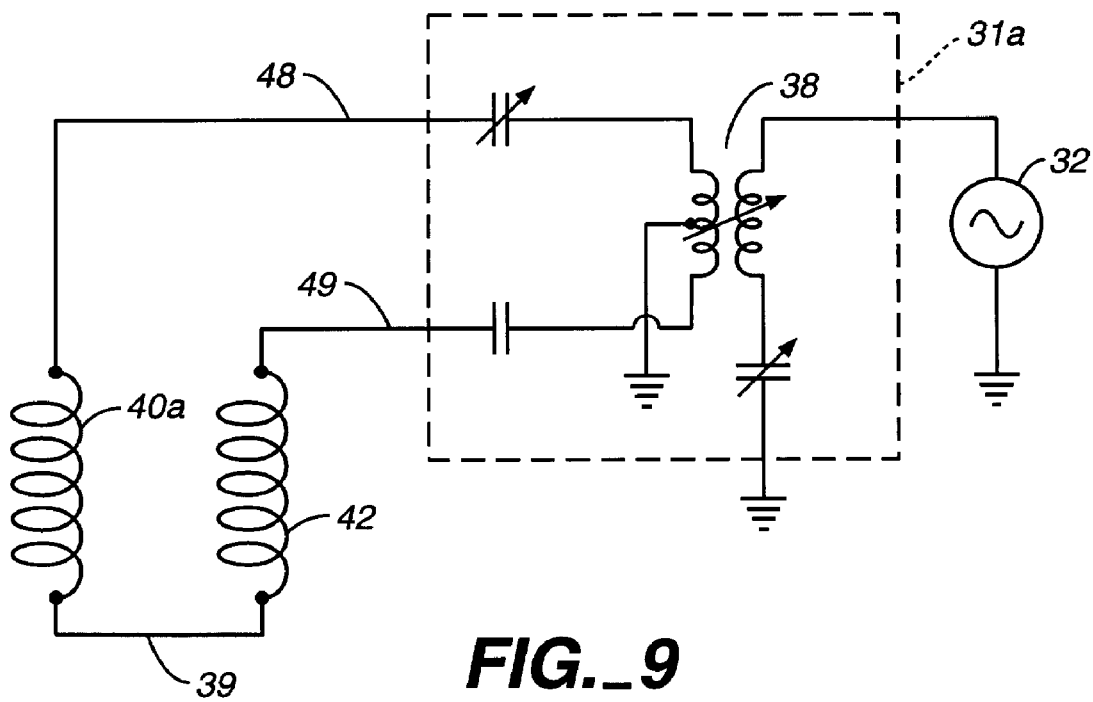
FIG._9

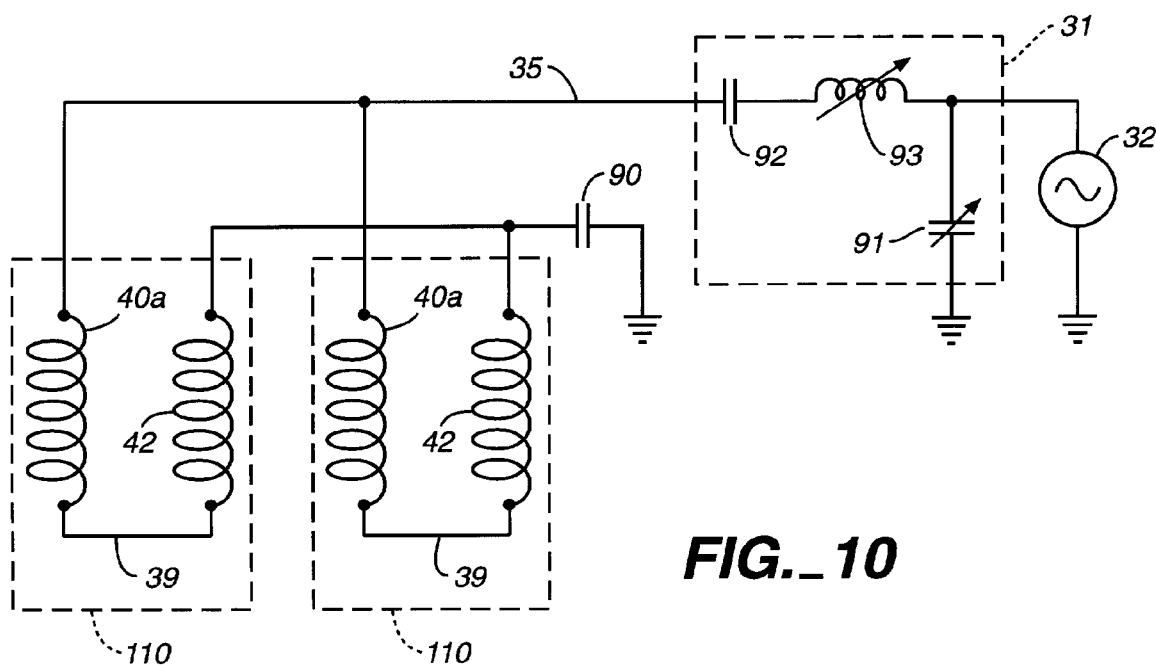
FIG._10
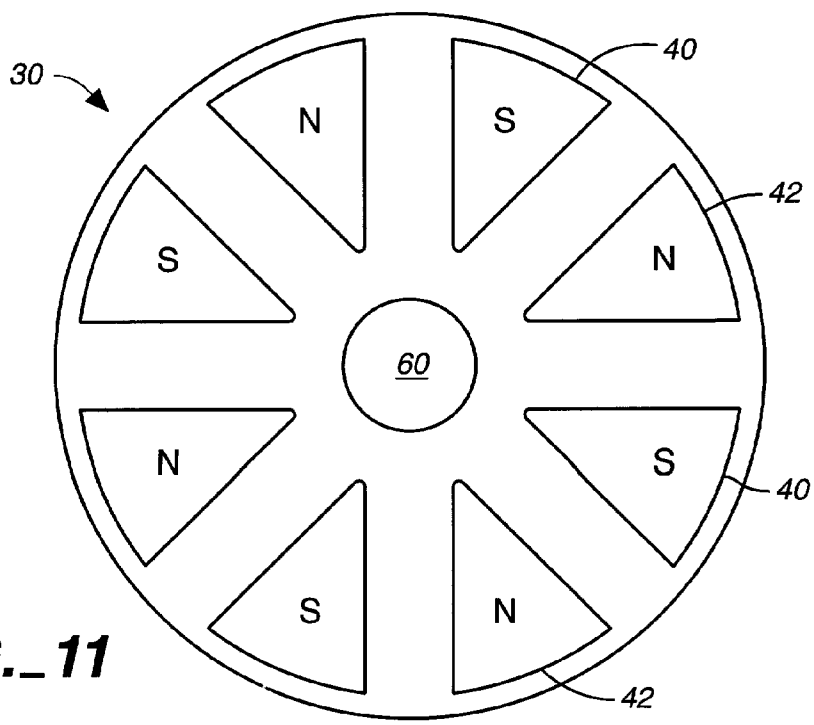
FIG._11

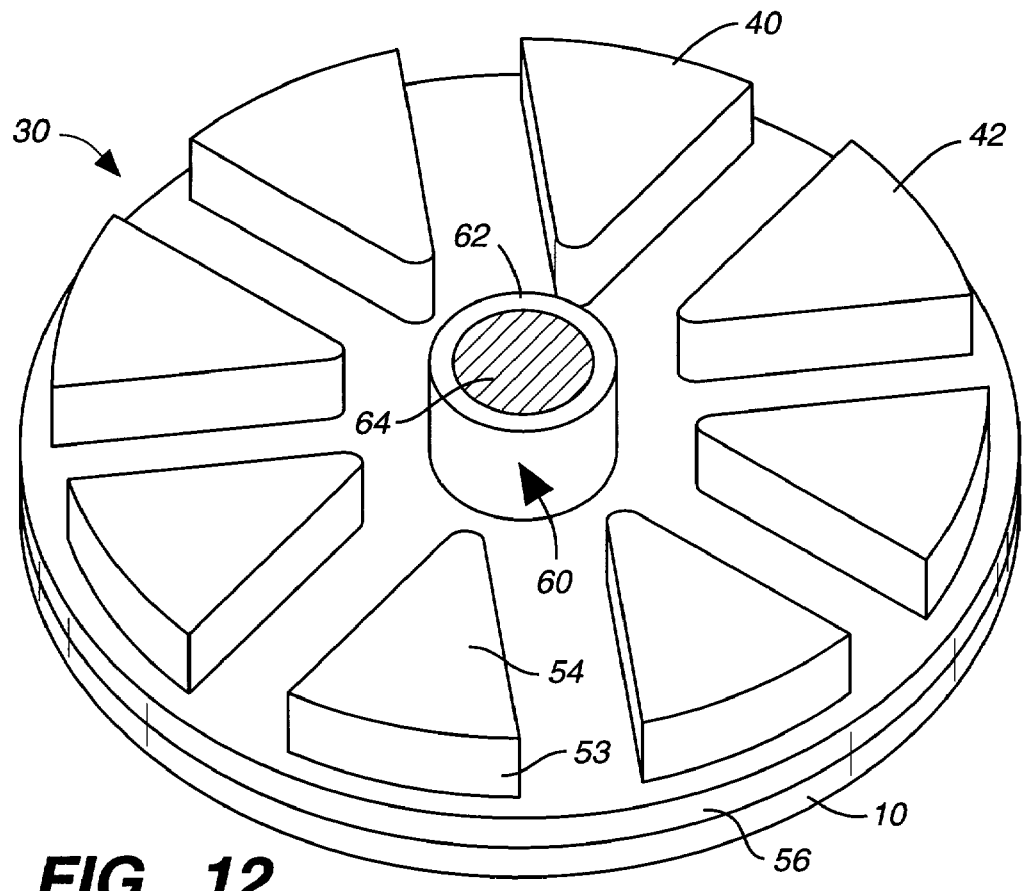
FIG._12
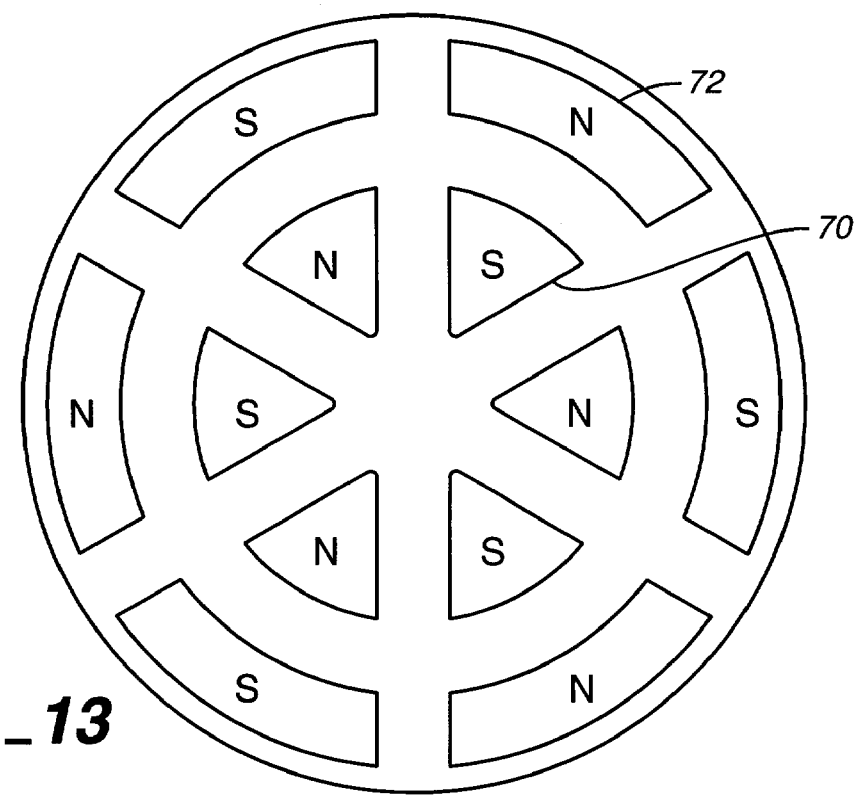
FIG._13

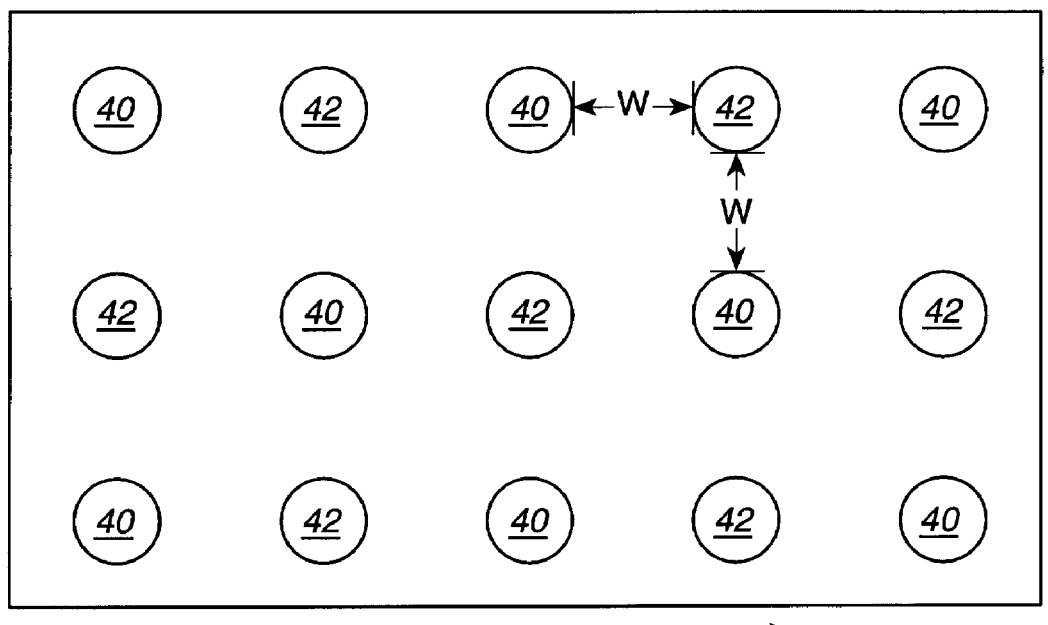
FIG._14
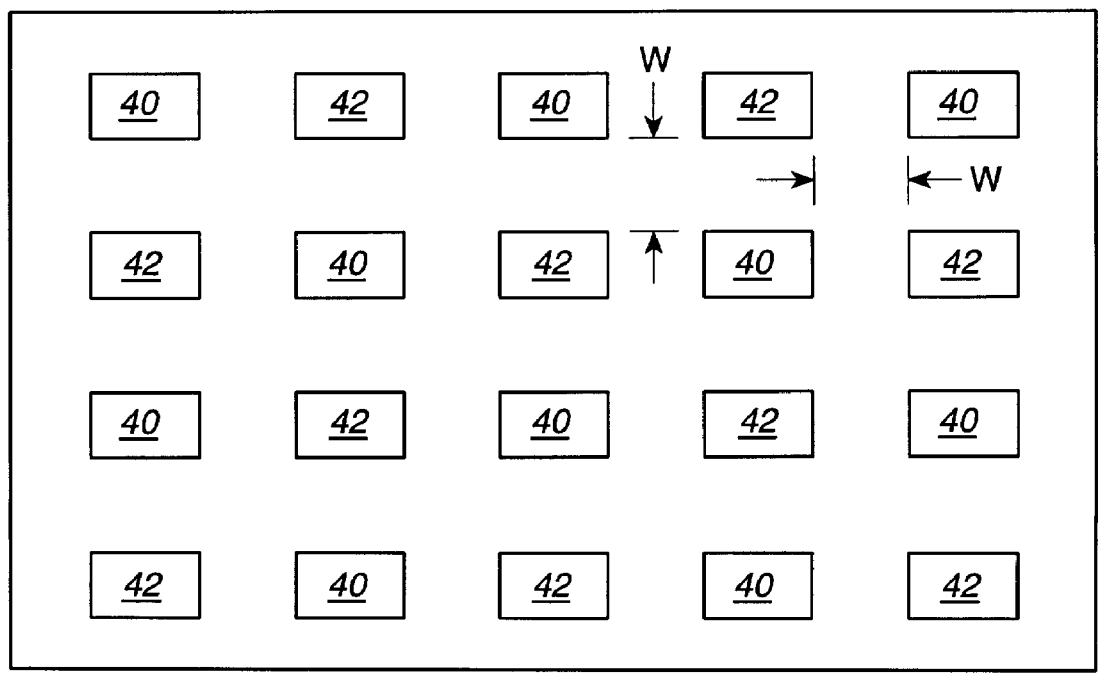
FIG._15

DISTRIBUTED INDUCTIVELY-COUPLED PLASMA SOURCE

FIELD OF THE INVENTION

This invention relates to inductively coupled plasma sources for semiconductor process chambers.

BACKGROUND OF THE INVENTION

Many processes for fabricating semiconductors, such as etching and deposition, are plasma-enhanced or plasma-assisted; that is, they employ process reagents excited to a plasma state within a vacuum chamber. Generally, the plasma is excited by coupling radio frequency (RF) electrical power to the process gas mixture. The RF electrical field dissociates atoms in the process gas mixture to form the plasma.

One method of coupling RF power to the process gases is inductive coupling, in which an RF power supply is connected to an induction coil which is mounted either inside the chamber or just outside a portion of the chamber wall which is dielectric. In comparison with a capacitively coupled plasma source, an advantage of an inductively coupled plasma source is that it permits adjusting the IF power supplied to the plasma independently of the DC bias voltage on the semiconductor workpiece.

Induction coils commonly are shaped as a solenoid which either encircles the cylindrical side wall of the vacuum chamber, or else is mounted on the circular top wall of the chamber. Other conventional induction coils are shaped as a planar or semi-planar spiral mounted on the circular flat or dome-shaped top wall of the chamber. The solenoid and spiral coils share the disadvantage of producing an IF electromagnetic field which extends along the axis of the coil toward the semiconductor workpiece. A large RF field near the workpiece can be undesirable because it possibly can damage the semiconductor devices being fabricated on the workpiece.

U.S. Pat. No. 5,435,881 issued Jul. 25, 1995 to Ogle discloses an inductively coupled plasma source which minimizes the RF magnetic field near the semiconductor workpiece. It employs an array of induction coils distributed over the dielectric, circular top wall of a process chamber. The axis of each coil is perpendicular to the chamber top wall and to the semiconductor workpiece, and adjacent coils are connected out of phase so as to produce opposite polarity magnetic fields. This arrangement produces a "cusp" magnetic field pattern in the "near field" adjacent the top wall, which excites the process gases to a plasma state. However, in the "far field" near the workpiece, the opposite polarity magnetic fields cancel out so that the magnetic field strength near the workpiece is negligible, thereby minimizing any risk of damage to the semiconductor devices being fabricated.

One disadvantage of the Ogle design is that the RF magnetic field is non-uniform near the perimeter of the induction coil array. Specifically, the perimeter of Ogle's magnet array deviates from the central pattern of evenly spaced, alternating polarity, magnetic poles. Such spatial non-uniformity in the RF field can produce undesirable spatial non-uniformities in the plasma-enhanced semiconductor fabrication process.

SUMMARY OF THE INVENTION

The present invention is an apparatus and method for inductively coupling electrical power to a plasma in a semiconductor process chamber.

In a first aspect, the invention comprises an array of induction coils distributed over a geometric surface having a circular transverse section. Uniquely, each coil has a transverse section which is wedge-shaped so that the adjacent sides of any two adjacent coils in the array are approximately parallel to a radius of the circular transverse section of the geometric surface.

The invention can produce a plasma adjacent a semiconductor workpiece in a plasma chamber having excellent spatial uniformity, i.e., uniformity in both the radial dimension and the azimuthal dimension. The plasma has excellent radial uniformity because the adjacent sides of adjacent coils are approximately parallel. It has excellent azimuthal uniformity because the coils are equally spaced azimuthally relative to the geometric surface.

Our invention can be adapted to operate over a wide range of chamber pressures. Some conventional designs couple energy to the plasma by continuously accelerating electrons at a resonant frequency, which can be achieved only at chamber pressures low enough to ensure that the mean free path of the electrons is greater than the spacing between the magnetic poles. In contrast, our invention does not require continuous acceleration of electrons, so it is not restricted to operation at low chamber pressures.

Our invention readily can be adapted to larger or differently shaped plasma chambers by adding induction coils to the array. It is straightforward to optimize our design for different processes and different chamber sizes and shapes, because the plasma enhancement contributed by any two adjacent coils is localized to the vicinity of the two coils. In contrast, it typically is much less straightforward to scale conventional designs which employ a single induction coil.

Preferably, the geometric surface is the surface of a flat, circular dielectric wall at one end of the process chamber, and the array of coils is mounted on the exterior surface of this wall. Alternatively, the array of coils can be mounted inside the vacuum chamber, in which case the geometric surface typically would not be a physical object, but merely a geometric shape.

In the preferred embodiments, adjacent coils produce magnetic fields of opposite polarity. Advantageously, in contrast with many conventional induction coil designs, the eddy currents induced by adjacent coils will tend to cancel out each other rather than additively reinforcing each other, so that no eddy current will circulate around the perimeter of the chamber wall 12.

The foregoing embodiment of the invention is ideal for cylindrical plasma chambers for processing circular semiconductor wafers. In alternative embodiment ideally suited for processing rectangular workpieces such as flat panel displays, the induction coils are arranged in a rectangular array or matrix rather than in a circular array. In a rectangular array, the coils need not be of a specific shape, and can be circular or rectangular in transverse section, for example. To maximize the lateral uniformity of the plasma, the lateral or transverse spacing "W" between the perimeters of adjacent coils should be equal for every pair of adjacent coils. The coils are connected to an RF power supply with respective polarities such that adjacent coils produce RF magnetic fields of opposite polarity.

In a second aspect of the invention, each induction coil is connected to the power supply in such a way that the turn of wire of the coil which is closest to the plasma is at or near electrical ground potential. This aspect of the invention minimizes capacitive (electrostatic) coupling between the induction coils and the plasma, thereby midnimizing sputtering of the chamber wall adjacent the coils.

In one embodiment, the end of each coil which is closest to the plasma is connected directly to electrical ground, and the opposite end of the coil is connected to an unbalanced output of an RF power supply. In a second and a third embodiment, two coils are connected in series by connecting together the end of each coil which is closest to the plasma. In the second embodiment, the opposite ("RF hot") end of each coil is connected to a respective balanced output of an RF power supply. In the third embodiment, the hot end of one coil is connected to the unbalanced output of an RF power supply, and the hot end of the other coil is connected to electrical ground through a capacitor which resonates with the latter coil at the frequency of the RF power supply.

A third aspect of the invention is the circuit used in the third embodiment of the preceding paragraph for coupling two coils to an unbalanced power supply output so as to maintain the junction between the two coils close to electrical ground potential. This circuit is novel and valuable independently of whether the coils are associated with a plasma chamber.

BRIEF DESCRIPTION OF THE DRAWINGS

FIG. 1 is a partially schematic, sectional, side view of a plasma chamber employing the invention.

FIG. 2 is a schematic top view of the array of induction coils in the chamber.

FIG. 3 is a partially schematic, perspective view of the induction coil array of FIG. 2.

FIG. 4 is a perspective view of one of the induction coils of FIGS. 1–3.

FIG. 5 is a sectional view of one of the induction coils of FIGS. 1–3.

FIG. 6 is an exploded perspective view of the induction coil of FIG. 5.

FIG. 7 is a sectional view of the induction coil array along a semicircular section path showing the azimuthally oriented magnetic cusp field.

FIG. 8 is an electrical schematic diagram of two adjacent coils connected in parallel between an RF power supply and electrical ground.

FIG. 9 is an electrical schematic diagrams of two series-connected adjacent coils connected to a balanced output of an RF power supply.

FIG. 10 is an electrical schematic diagram of two series-connected adjacent coils connected to an unbalanced output of an RF power supply, including a novel feature in which one coil is connected to electrical ground through a capacitor.

FIG. 11 is a schematic top view of an alternative induction coil array including a center coil.

FIG. 12 is a partially schematic, perspective view of the induction coil array of FIG. 11.

FIG. 13 is a schematic top view of an alternative induction coil array having concentric coils.

FIG. 14 is a schematic top view of a rectangular array of cylindrical induction coils.

FIG. 15 is a schematic top view of a rectangular array of induction coils, wherein each coil has a rectangular transverse cross section.

DETAILED DESCRIPTION OF THE PREFERRED EMBODIMENTS

FIG. 1 shows a plasma chamber utilizing the present invention. The illustrated chamber is intended for plasma-enhanced etching of dielectric films on silicon wafers, but the invention is equally useful in any plasma chamber used for semiconductor fabrication processes such as etching, chemical vapor deposition, or sputter deposition.

The vacuum chamber has a cylindrical aluminum side wall 12, a circular aluminum bottom wall 14, and a circular top wall or lid 10 composed of a dielectric material such as aluminum oxide ($AlO_3$, commonly called alumina), aluminum nitride, or silicon carbide. We prefer alumina, primarily because it has been used successfully as a dielectric in many other plasma chamber designs, and also because it is much less expensive than the other contemplated dielectric materials.

The chamber side wall and bottom wall are electrically grounded. An aluminum cathode electrode 16 is oriented perpendicular to the cylindrical axis of the chamber and is electrically insulated from the grounded chamber walls by dielectric support shelf 18. A semiconductor workpiece such as a silicon wafer (not shown) is mounted on the top face of the cathode electrode by conventional means such as a mechanical clamp ring or an electrostatic chuck. Such chamber construction is completely conventional.

Process gases 22 flow into the chamber through several gas inlet ports (not shown) which are azimuthally spaced around the chamber side wall 12, below the lid 10. First and second RF power supplies 32 and 34 couple RF power to the chamber interior 100 so as to form a plasma from the process gases.

An exhaust pump, not shown, is mounted outside the exhaust port 24 in the chamber bottom wall 14. The pump exhausts the process gases and reaction products from the chamber through sinuous exhaust baffle 25, and then out the exhaust port 24.

The sinuous exhaust path imposed by the preferred exhaust baffle 25 functions to block the plasma from reaching the exhaust port. The exhaust baffle consists of overlapping lateral extensions of anodized aluminum outer liner 26 and inner liner 27. The liners are removable to facilitate cleaning. The sinuous exhaust baffle and liners are described more fully in commonly assigned, U.S. Pat. No. 5,892,350 issued Shan et al., the entire content of which is hereby incorporated by reference into this patent application.

The upper end of the outer liner 26 includes an inwardly extending, annular shelf 28 on which the lid 10 rests, with an intervening O-ring 29 to provide a vacuum seal. A gas passage in the outer liner provides flow of process gas 22 to the inlet ports.

The first RF power supply 32 supplies electrical power through a first impedance matching network 31 to a novel array 30 (FIG. 2) of induction coils mounted on the dielectric chamber lid 10 (FIG. 1) Each coil 40, 42 in the array 30 is wound around an axis which is parallel to the chamber axis, i.e., is perpendicular to the chamber lid and to the semiconductor workpiece. The RF current through the induction coils produces an RF electromagnetic field in the region of chamber just below the lid so as to couple RF power to the plasma and thereby enhance the density of the plasma. (FIG. 7 depicts the RF magnetic field lines 120.)

Conventionally, a second impedance matching network 33 capacitively couples the second RF power supply 34 to the cathode electrode 16 so as to produce a negative DC bias voltage on the cathode electrode relative to the electrically grounded chamber walls. The negative bias voltage on the cathode electrode 16 attracts ions from the process gas mixture toward the semiconductor workpiece so that the process gases perform a desired semiconductor fabrication process on the surface of the workpiece, such as a conventional process for etching an existing film on the workpiece surface or for depositing a new film on the surface.

FIGS. 2–4 and 6 depict the wedge shape of each of the eight induction coils 40, 42 in the array 30, the coils being equally spaced around the azimuth of the chamber lid 10. As shown in FIGS. 4–7, each coil 40, 42 has a number of turns of copper wire 43 wound around a hollow coil form 50. Each coil form has a wedge-shaped top surface 54 as shown in FIGS. 2–4, and each has a U-shaped cross section when viewed from the side as shown in FIGS. 4–6. Specifically, each coil form 50 consists of a curved, rectangular, wide outer surface 53; an almost triangular, wedge-shaped top surface 54; and a curved, narrow, inner tip surface 55. The azimuthal sides 44 of each coil form are completely open, as shown in FIGS. 4–7.

Each coil form 50 is composed of dielectric material so that the coil windings can touch the form without being electrically shorted. The coil forms preferably should have a very low dielectric constant so as to minimize the parasitic capacitance across the coil windings, and thereby raise the self-resonant frequency of the coils. Our preferred material for the coil forms is Teflon.

To facilitate mounting or removing the induction coil array as a single unit without opening the chamber lid 10, the eight wedge-shaped coil forms 50 are attached by push-on fasteners 51 to a single, disc-shaped base 56. In the preferred embodiment, the base 56 is composed of a plastic material having higher mechanical rigidity than the Teflon used for the coil forms. The preferred plastic is sold by Dupont under the trademark Ultem. It commonly is called "natural Ultem" to distinguish it from "black Ultem" which includes carbon.

Preferably, each induction coil 40, 42 encircles a magnetic core 52. We believe the magnetic cores 52 concentrate and shape the magnetic field so that the magnetic flux lines 120 extending between adjacent coils 40, 42 will be concentrated primarily in an arc extending through the interior 100 of the plasma chamber between the respective lower axial ends of each coil as shown in FIG. 7. Without the magnetic cores 52, a greater proportion of the magnetic flux would extend laterally between the central turns 43 of the coils above the lid 10. In other words, we believe the magnetic cores 52 concentrate the magnetic flux 120 in the region of the chamber interior 100 occupied by the plasma, thereby improving the efficiency with which the induction coils 40, 42 couple RF power to the plasma.

In the preferred embodiment, the magnetic core of each induction coil consists of twelve bars 52 of magnesium zinc soft ferrite having a magnetic permeability of approximately 40 to 60. (The vendor of the ferrite we tested claims the permeability is 60, but reference books generally show a permeability of 40 for magnesium zinc ferrite.) To permit air cooling of the ferrite bars, the ferrite bars are spaced apart. The gaps between ferrite bars are occupied by air. To maintain the spacing and alignment of the ferrite bars, the top of each bar occupies a distinct opening in the top 54 of the coil form 50, and the bottom of each bar occupies a distinct opening in the base plate 56. The openings in the base plate also have the advantage of lowering the bottom of each ferrite bar so as to be closer to the chamber lid 10, thereby maximizing the strength of the magnetic field produced in the chamber by the coil array 30.

The coils are connected to the first RF power supply 32 in such a way that, during any halfcycle of the RF current waveform, the current flow through half the coils 40 is clockwise, and the current flow through the other half of the coils 42 is counterclockwise, with the coils of the two polarities being positioned alternately around the azimuth of the array. FIGS. 2 and 7 illustrate this alternating arrangement by labelling successive coils 40, 42 alternately as S and N, respectively, to represent the magnetic field produced by each respective coil during one half-cycle of the RF current waveform. During the next half-cycle, the south and north magnetic poles will be interchanged.

The alternating polarity magnetic fields from the array 30 of coils produces in the "near field" (i.e., near the chamber lid 10) a resultant magnetic field having a "cusp" pattern, as depicted by magnetic field lines 120 in FIG. 7. Consequently, the electrical power provided by the RF power supply 32 is coupled to the process gas mixture adjacent the chamber lid 10 so as to enhance the density of the plasma.

Each coil is wedge-shaped so that the adjacent sides 44 of any two adjacent coils are approximately parallel. Except at the center of the lid, the azimuthal gap "W" between two azimuthally adjacent coils is approximately the same at all radial positions, so that the coils produce a magnetic field with excellent radial uniformity.

At increasing distances from the bottom of the induction coil array 30, the magnetic field strength rapidly drops to negligible levels, because the magnetic field lines of opposite polarity cancel each other out. We refer to as the "far field" the region within the chamber which is sufficiently far from the bottom of the coil array that the magnetic field strength is at least one or two orders of magnitude less than the magnetic field strength adjacent the lid. We refer to as the "penetration distance" the distance the magnetic cusp field 120 extends into the chamber; i.e., the penetration As distance is the depth of the "near field".

Preferably, the semiconductor workpiece (mounted on the cathode electrode 16) is far enough from the induction coil array 30 to be located in the far field where the magnetic field strength is negligible. This is advantageous for two reasons.

First, minimizing the magnetic field at the semiconductor workpiece sometimes can help minimize the risk of damaging the semiconductor devices being fabricated on the workpiece, although the importance of minimizing the magnetic field also depends on other parameters of the semiconductor fabrication process being performed and on the dielectric and semiconductor structures already fabricated on the workpiece.

Second, locating the workpiece a distance from the coil array which is substantially beyond the penetration distance smooths out the effects of localized spatial nonuniformities in the magnetic field strength in the near field. Specifically, we observe the plasma glow is brightest, indicating the magnetic field is strongest, near the gaps between adjacent coils. If the workpiece were positioned too close to the coil array, the process rate on the workpiece would exhibit peaks and valleys corresponding to the locations of the gaps between coils and the coil centers, respectively. Conversely, at increasing distances substantially beyond the penetration distance of the magnetic field, the plasma density becomes progressively more uniform due to diffusion. Therefore, when the workpiece is positioned substantially beyond the penetration distance, the semiconductor fabrication process can achieve excellent spatial uniformity.

Because the induction coil array enhances the plasma density in the near field, the plasma density in the far field (substantially beyond the penetration distance of the magnetic field from the coil array) generally is lower than the plasma density in the near field. Consequently, the process rate on the workpiece will be undesirably reduced if the workpiece is positioned greater distances beyond the penetration distance. For example, in tests performed using a process for etching a silicon oxide film on a silicon wafer, we found that the etch rate desirably increased as we positioned the coil array and the workpiece (wafer) closer together. Therefore, designing the penetration distance of the coil array and the mounting location of the workpiece involves a balancing between improving the process rate when the workpiece is closer to the penetration distance and improving the process spatial uniformity when the workpiece is farther beyond the penetration distance.

The plasma density has a radial distribution in the vicinity of the coil array 30 which is quite different from its radial distribution in the vicinity of the workpiece. Specifically, as ions from the plasma migrate from the vicinity of the coil array toward the workpiece, the plasma density near the perimeter of the chamber (and the perimeter of the workpiece) tends to be reduced by recombination of ions at the chamber side wall 12. Consequently, in order to maximize the radial uniformity of the plasma density in the vicinity of the workpiece, the magnetic field pattern of the coil array preferably should produce a plasma whose density is radially non-uniform: specifically, whose density is stronger near the perimeter of the coil array than at the center of the coil array. Accordingly, in the illustrated preferred embodiment the coil array 30 has a central region with no induction coils so as to produce a maximum RF magnetic field near the perimeter of the coil array. Lateral diffusion as the plasma species migrate from the vicinity of the coil array toward the workpiece augments the plasma density near the center axis and results in a radially uniform plasma density adjacent the workpiece.

To farther maximize the plasma density near the chamber side wall 12, the diameter of the coil array preferably is close to or greater than the diameter of the chamber. In the illustrated preferred embodiment, this is accomplished by positioning the outer edge 53 of the coils as close as possible to the cover 58. Advantageously, our design permits positioning the coils close to the cover 58 or chamber side wall 12 without inducing large eddy currents in the cover or side wall.

Eddy currents are undesirable because they dissipate power from the RF power supply 32 as heat, thereby reducing the power coupled to the plasma. In our design, to the extent an individual coil 40 or 42 tends to induce eddy current in the chamber wall, the cumulative eddy current induced by the entire coil array 30 is minimized because adjacent coils have magnetic fields of opposite polarity, and therefore induce eddy currents of opposite polarity. Therefore, in contrast with many conventional induction coil designs, the eddy currents induced by adjacent coils will tend to cancel out each other rather than additively reinforcing each other, so that no eddy current will circulate around the perimeter of the chamber wall 12.

The illustrated preferred embodiment was implemented for use in a plasma chamber for fabricating 8-inch diameter silicon wafers. In this embodiment, the diameter of the coil array is 12 inches (30 cm), and the axial length or height of each coil is 2 inches (5 cm). The gap W between parallel faces 44 of adjacent coils is 1.25 inch (3.2 cm). The diameter D of the central region of the coil array, between tips 55 of opposite coils, is 3.9 inches (9.9 cm). Each coil has 3¾ turns of copper wire 43. The alumina ceramic lid 10 is 12 inches (30 cm) in diameter and 0.65 inch (1.65 cm) thick. The cathode electrode 16 supports an 8-inch silicon wafer 3 inches (7.6 cm) below the lid.

In tests of this embodiment using a standard process for etching a silicon oxide layer on an 8-inch silicon wafer, the etching appeared spatially uniform, with no visually observable pattern etched on the wafer corresponding to the shape of the ferrite cores or the wedge-shaped coils. We measured a one-sigma spatial nonuniformity of etch rate equal to only one percent (with 3 mm edge exclusion). Such excellent observed and measured etch rate uniformity implies that the magnetic field strength at the wafer was negligible, and that the magnetic field uniformity adjacent the lid was at least as good as necessary to achieve excellent process uniformity on the wafer.

The shape and uniformity of the magnetic field are affected by the relative values of the following dimensions: the axial length or height "H" of the coils; the azimuthal gap "W" between adjacent coils; and the diameter "D" of the central area of the coil array which is not occupied by a coil, i.e., the diameter bounded by the tips of radially opposite coils (see FIGS. 2 and 5); and the angular center-to-center spacing between azimuthally adjacent coils.

The azimuthal gap W and the angular center-to-center spacing between azimuthally adjacent coils are important design parameters because they affect the "penetration distance" by which the magnetic cusp field extends below the chamber lid 10 into the chamber interior 100. Increasing the azimuthal gap W between coils or the angular center-to-center spacing between coils typically will increase the penetration distance of the magnetic field. Optimizing the penetration distance of the magnetic field typically should be the primary consideration in selecting the azimuthal gaps when designing the induction coil array 30.

The optimum penetration distance of the magnetic field balances considerations of process rate and spatial uniformity. Increasing the penetration distance can be advantageous because it increases the volume of the plasma below the lid to which the RF power is coupled. However, decreasing the penetration distance can be advantageous by allowing the semiconductor workpiece to be positioned closer to the coil array 30 while still remaining in the far field where the magnetic field is negligible. For a given penetration distance, the distance of the workpiece beyond the penetration distance affects process rate and spatial uniformity as described above.

Even with the workpiece only 3 inches below the lid in the preferred embodiment just described, we found that the magnetic field strength at the workpiece was negligible, as evidenced by the absence of significant azimuthal variation in etch rate in the tests just described. Therefore, the effective penetration distance of the magnetic field must have been less than 3 inches.

The illustrated preferred embodiment employs eight wedge-shaped coils 40,42 spaced around the azimuth of the chamber lid 10. Accordingly, the angular center-to-center spacing between adjacent coils is 360°/8=45°. Increasing the number of coils, and thereby decreasing the angular spacing between coils, would be expected to produce two effects. First, it would improve the azimuthal uniformity of the plasma near the workpiece. Second, if the azimuthal gap W between coils were reduced in proportion to the reduced angular spacing between coils, the penetration distance of the magnetic field into the chamber would be reduced as described above.

The preceding discussion of adjusting the penetration distance of the magnetic field by adjusting the azimuthal gap W or the angular center-to-center spacing assumes that the magnetic field produced by the coils appears primarily in the gaps between adjacent coils, as shown by the field lines 120 in FIG. 7, rather than being directly under each coil as would be the case if adjacent coils were of the same polarity rather than opposite polarities.

In the preferred embodiment whose dimensions were stated above, the ratio of the coil height H to azimuthal gap W is about 1.6, i.e., H:W=1.6:1. Tests also were performed on an embodiment in which the azimuthal gap W was increased from 1.25 in. to 5 in., so that the gap was 2.5 times greater than the coil height, thereby inverting the ratio, i.e., H:W=1:2.5. The tests showed areas of maximum etch rate on the areas of the workpiece directly under each coil. This indicates that the magnetic field produced by each coil was concentrated under the coil when H:W=1:2.5, rather than extending between adjacent coils as when H:W=1.6:1.

Extrapolating from this result, we believe that H:W preferably should be greater than one—i.e., the axial coil length or height should be greater than the azimuthal gap W between adjacent coils—in order to produce a magnetic field pattern that extends uniformly across the gaps between coils rather than being concentrated directly below each coil. We believe such pattern will provide the best spatial uniformity of the plasma in the vicinity of the workpiece, and it will permit adjusting the penetration distance of the magnetic field as described above.

If the diameter D of the central area is too large relative to the azimuthal gaps W between adjacent coils, there will be a drop in magnetic field strength near the center of the coil array. As stated above, we observed excellent process uniformity with D=3.9 in. and W=1.25 in. Conversely, if the diameter D is substantially reduced to a value comparable to the azimuthal gap W, or even less, all the coils will be close enough to the center to strongly interact in a complex manner which we have not tested or analyzed. Therefore, we presently cannot predict the pattern of the resulting magnetic field.

One advantage of our invention is that it is straightforward to optimize the design for different processes and different chamber sizes and shapes, because the plasma enhancement contributed by any two adjacent coils is localized to the vicinity of the two coils. For example, it is easy to optimize our design to maximize spatial uniformity by increasing or decreasing the magnetic field produced by those coils closest to the areas of the semiconductor workpiece where the plasma density or process rate is lowest or highest. As another example, our design can be adapted to a larger chamber by simply adding more coils and/or increasing the size of each coil.

As yet another example, our design can be adapted to a rectangular chamber for manufacturing rectangular flat panel displays by arranging the coils in a rectangular array or matrix rather than in a circular array. To maximize the lateral uniformity of the plasma density in the vicinity of the workpiece, the lateral or transverse spacing "W" between the perimeters of adjacent coils should be equal for every pair of adjacent coils. In the previously described chamber having a circular transverse cross section, as would be used for fabricating circular semiconductor wafers, such uniform spacing "W" is best achieved using wedge-shaped coils. In a chamber having a rectangular transverse cross section for fabricating a rectangular semiconductor workpiece, uniform spacing "W" can be achieved independently of the shape of each induction coil, provided the gaps "W" between the perimeters of the coils are uniform. FIG. 14 illustrates a rectangular array of induction coils 40, 42 in which the coils are cylindrical, i.e., each coils has a circular transverse section. FIG. 15 illustrates a rectangular array in which each coil has a rectangular transverse section.

Regulating the temperature of the lid 10 is important for at least two reasons. First, the temperature of the lid (and of other chamber surfaces exposed to the plasma) strongly affects the performance of the plasma process. Therefore, the temperature of the lid should be regulated to ensure consistent process performance. Second, in processes that unavoidably deposit polymers on the lid, excessive temperature fluctuations can cause the polymer to flake off and contaminate the workpiece.

The temperature of the lid will tend to rise while the plasma is present in the chamber, due to absorption of heat from the plasma and absorption of both heat and RF energy from the coils 40, 42. Conversely, the temperature of the lid will fall while the plasma is off during the times that workpieces are unloaded and loaded into the chamber.

To regulate the temperature of the lid, our preferred embodiment of the lid includes channels (not shown in the drawings) through which we pump a dielectric cooling fluid, preferably a mixture of deionized water and ethylene glycol. An external control system regulates the temperature of the cooling fluid at 50° C.

If each coil 40, 42 includes a magnetic core 52 as in the illustrated preferred embodiment, it also is important to regulate the temperature of the magnetic cores, because the magnetic permeability of most magnetic materials is temperature dependent. For most ferrite materials, the magnetic permeability increases with temperature up to a maximum value at a certain threshold temperature, and then decreases at temperatures above the threshold. For the particular manganese-zinc ferrite used in our preferred embodiment, the threshold temperature is about 100° C.

When the temperature of the magnetic core is above the threshold temperature, there is a risk of an uncontrolled increase in temperature (thermal runaway), because the increasing temperature of the magnetic cores will decrease their magnetic permeability, which will decrease the inductance of each coil, which will increase the current through each coil, and hence will further increase the temperature of the cores. by increasing the electrical current through the coil. To ensure against such thermal runaway, it is highly preferable to maintain the temperature of the magnetic cores below their threshold temperature.

Beyond maintaining the magnetic cores 52 below their threshold temperature, it is preferable to regulate the temperature of the cores to limit their temperature fluctuations as much as practical. As temperature fluctuation changes the inductance of the coils 40,42, the variable inductors and/or variable capacitors in the impedance matching network 31 must be adjusted to maintain a constant level of RF power coupled to the plasma from the RF power supply 32. Conventional matching networks 31 can perform the necessary adjustments automatically and continuously. However, the wider the range over which the temperatures of the magnetic cores are permitted to fluctuate, the wider the adjustment range required for the variable inductors and/or variable capacitors in the impedance matching network, thereby increasing the cost of the variable inductors and/or variable capacitors. Therefore, to minimize the cost of the matching network, it is preferable to regulate the temperature of the cores to limit their temperature fluctuations as much as practical.

In the presently preferred embodiment, we cool the ferrite cores 52 by two means. First, a fan (not shown) is mounted above the coil array 30 and blows relatively cool, ambient air downward over the coil array. The cooling is facilitated by the coil forms 50 being hollow and being open at their azimuthal sides 44, so that sides of the ferrite cores are completely exposed to the cool air. Second, the previously described temperature regulation of the chamber lid 10 helps cool the coil array due to heat transfer between the lid and both the coil forms 54 and the base plate 56. Consequently, we maintain the temperature of the ferrite cores within the range of 20° to 45° C.

It is conceivable that more aggressive cooling mechanisms may be required in other applications requiring higher RF power. For such applications, we contemplate the possibility of employing forced gas cooling of the coil array 30. Specifically, we contemplate pumping air or nitrogen gas into channels formed within the base plate 56, from which the gas would flow upward over the coils 40, 42 and then be exhausted by a gas exhaust manifold positioned above the coil array. Since the magnetic field strength declines rapidly with axial distance away from the coil array 30, the dielectric lid 10 which separates the coil array from the plasma should be as thin as possible, although not so thin as to be easily cracked or otherwise damaged. As stated earlier, the lid in the presently preferred embodiment is 0.65 inch thick. The reason the preferred lid is so thick is to accommodate the water cooling channels just described. We expect that the lid thickness could be reduced to half this amount by omitting the cooling passages. However, we currently consider it impractical to omit the cooling channels because of the importance of regulating the lid's temperature as described above.

In the illustrated embodiment, the base 56 is not fastened directly to the lid 10 because the alumina material of the lid is not strong enough to reliably withstand the stress of being rigidly bolted to the coil array. Instead, the base is attached to a metal cover 58, and the cover is attached to the chamber wall 12. The purpose of the cover is simply to prevent RF radiation from the coils which may interfere with other electrical equipment nearby, and to protect people from the risk of touching the coils and receiving an electrical shock. More specifically, the base is attached to the metal cover by four L-shaped, threaded, dielectric standoffs 57 which are fastened by screws 59 to corresponding mounting holes in the perimeter of the base 56 and in the cover 58.

To ensure consistency and repeatability of process performance, it is important to accurately align the center of the coil array 30 with the central axis of the chamber. Therefore, the standoffs, fasteners, and mounting holes just described, which determine the position of the base 56 relative to the chamber, must have tight dimensional tolerances. We find it practical to maintain dimensional tolerances no greater than a few mils, i.e., about 0.1 mm.

The alignment of the lid 10 is less critical than the alignment of the coil array, since the lid has no electrically active components. In the illustrated preferred embodiment, the perimeter of the lid simply rests on the inwardly protruding shelf 28 of the outer liner 26. No fasteners are used; until the chamber is evacuated the lid is held in place only by its own weight. When a vacuum is created in the chamber, the atmospheric pressure on the outside of the lid holds the lid tightly in place.

To maximize the magnetic field strength in the plasma chamber, it is desirable to mount the base 56 as close as possible to the lid 10. Our preferred method of mounting the base allows it to rest directly on the lid. Specifically, the holes in the cover 58 through which screws 59 extend are vertically elongated, thereby allowing the base 56 to move vertically relative to the cover before the screws are tightened. First, the entire coil array 30 is loosely attached to the cover by extending screws 59 through the holes in the cover and partially threading them into the standoffs 57. Second, the resulting assembly is lowered onto the chamber lid, so that the base 56 rests on the lid 10. Finally, the cover is bolted to the chamber, and the screws 59 are tightened to rigidly maintain the alignment of the coil array.

FIGS. 8–10 respectively show three alternative circuits for producing opposite magnetic field polarities in each pair of adjacent coils 40,42. To simplify the drawings, FIGS. 8–9 show only one of the four coil pairs, and FIG. 10 shows only two of the four coil pairs. In all three circuits of FIGS. 8–10, the four pairs of coils actually are connected in parallel with each other to the output of the impedance matching network. FIG. 10 illustrates the parallel connection of the four coil pairs by showing two of the coil pairs 110 connected in parallel with each other.

In the FIG. 8 design, all 8 coils 40, 42 are connected in parallel to the power supply 32; hence the power supply must deliver to the coil array a total current equal to 8 times the current through each individual coil. In the designs shown in FIGS. 9 and 10, each pair 110 of adjacent coils 40a, 42 is connected in series, and the resulting four series-connected pairs of coils are connected in parallel to the power supply 32. Consequently, the power supply must deliver to the coil array a total current equal to four times the current through each individual coil. We consider the FIG. 8 design less desirable because it requires the power supply to deliver twice the current required in the designs of FIGS. 9 and 10.

For many semiconductor fabrication processes, it is desirable for the RF power from the first power supply 32 to be coupled to the plasma inductively rather than capacitively (i.e., electrostatically) to the greatest extent possible, so as to minimize sputtering of the chamber lid by ions from the plasma. All of the wiring schemes shown in FIGS. 8–10 share the advantage of maintaining the lowermost turn of each coil at, or close to, electrical ground potential. Consequently, the portion of each coil which is closest to the plasma will have the lowest RF voltage, thereby reducing capacitive coupling between the coil and the plasma.

A conventional Faraday shield can be mounted between the induction coil array and the chamber interior if it is desired to further reduce capacitive (electrostatic) coupling between the coils and the plasma.

In the FIG. 8 embodiment, the first coil 40 is wound counterclockwise, while the second coil 42 is wound clockwise. The lowermost turn of each coil is connected to electrical ground. The uppermost turn of each coil is connected to the output 35 of an unbalanced impedance matching network 31, which receives its input from RF power supply 32. Because the two coils 40, 42 are wound in opposite directions, they produce respective magnetic fields of opposite polarity when driven by the same RF current.

In the embodiments of FIGS. 9 and 10, both coils 40a and 42 are wound in the same direction, which is illustrated as clockwise but could be counterclockwise just as suitably. The two coils are connected in series by connecting the lowermost turn of the first coil to the lowermost turn of the second coil at junction 39.

In the FIG. 9 design, the RF power supply 32 is connected to the two coils of each pair through an impedance matching network 31a which provides a balanced (i.e., differential) output signal between the two outputs 48, 49. The first output terminal 48 of the matching network is connected to the uppermost turn of the first coil 40*a*, and the second output terminal 49 is connected to the uppermost turn of the second coil 42. The two coils 40*a* and 42 produce respective magnetic fields of opposite polarity because the direction of current flow in one coil is opposite the direction of current flow in the other coil. The lowermost turn of each coil 40*a*, 42 (connected together at junction 39) is at electrical ground potential because the two outputs of the matching network are balanced relative to the grounded transformer center tap.

A possible modification (not shown) of the FIG. 9 design would be to eliminate the center tap of the transformer secondary winding, in which case the induction coils 40*a*, 42 would be "floating" relative to ground, i.e., no path would exist to connect the secondary winding and the induction coils to ground. In this alternative "floating" implementation, the lowermost turn of each coil and junction 39 still would be maintained close to electrical ground potential because the layout of the coil array is symmetrical relative to the balanced outputs 48, 49 of the impedance matching network.

In the FIG. 9 design, the impedance matching network 31a employs a transformer 38 to convert the unbalanced output of the power supply 32 to a balanced output 48, 49. A disadvantage of the FIG. 9 design is that it is difficult to design an efficient, high power, RF transformer, i.e., one which can withstand high RF voltages without arcing, which has sufficiently low resistance to achieve high efficiency, and which has a high coefficient of coupling between the primary and secondary windings.

FIG. 10 shows a novel circuit for driving each induction coil pair 110 so that the junction 39 between the two coils 40*a*, 42 of each pair is approximately at electrical ground potential. In contrast with the FIG. 9 design which requires an impedance matching network 31 a having a pair of balanced outputs 48–49, the FIG. 10 design works with any conventional impedance matching network 31 having an unbalanced output 35.

X0 Specifically, in the FIG. 10 design, the "hot" end of the first induction coil 40*a* (i.e., the end of the first coil 40*a* which is not connected to the second coil 42) is connected to the output 35 of the matching network 31, and the "hot" end of the second induction coil 42 is connected to electrical ground through a capacitor 90. The capacitor 90 has a capacitance value chosen to create a series resonance with the inductance of the second induction coil 42 at approximately the frequency of the RF power supply 32. Because of this series resonance, the junction 39 between the two induction coils is close to electrical ground. Since the capacitive reactance of capacitor 90 approximately cancels out the inductive reactance of the second coil 42, the impedance of the load connected to the output 35 of the impedance matching network 31 is approximately the inductance of the first coil 40*a* plus the load impedance of the plasma (plus a smaller resistive component due to heat dissipated in the ferrite cores).

Because the induction coil pairs 110 are connected in parallel with each other, the inductance with which the capacitor 90 should resonate at the frequency of the RF power supply is the parallel combination of the respective second coils 42 of every coil pair 110. If there are N identical coil pairs, the combined inductance of the N second coils 42 will be the inductance of one second coil 42 divided by N. Consequently, the required capacitance value for capacitor 90 will be N multiplied by the capacitance which would resonate with one of the second coils 42 at the frequency of the RF power supply. (In the preferred embodiment of FIGS. 1–7, there are four coil pairs 110, hence N=4.)

While any conventional impedance matching network 31 can be used, FIGS. 8 and 10 show our preferred circuit for the matching network, which is a conventional "L network". The network transforms the plasma load impedance to match the 50 ohm resistive output impedance of the power supply 32. The variable "load" capacitor 91 and the variable "tuning" inductor 93 preferably are adjusted by a feedback control loop to minimize the reflected power at the output of the RF power supply 32, as measured by a conventional reflected power detector. When the network is adjusted for minimum reflected power, the inductance of the "tuning" inductor 93 generally will be adjusted so that the series combination of the three capacitors 90, 91, 92 and the three inductors 40*a*, 42, 93 resonates at approximately the frequency of the RF power supply 32. The input impedance into which the plasma load impedance is transformed is determined primarily by the adjusted value of the "load" capacitor 91.

Alternatively, the fixed capacitor 92 can be replaced with a variable "tuning" capacitor, in which case the "tuning" inductor 93 can be eliminated. However, we consider a variable inductor preferable to a variable capacitor for this high voltage application, because a suitable variable capacitor would be much more expensive. Also, the tuning shaft of a typical high voltage variable capacitor has high rotational friction which impedes rapid tuning of the impedance matching network.

In contrast, the "load" capacitor 91 has a much lower impedance, hence need not withstand such high voltages and can be procured or fabricated economically. Our preferred design for the variable "load" capacitor is described in commonly assigned application Ser. No. 08/954,376 filed Oct. 20, 1997 by Richard Mett et al. entitled "High Efficiency Impedance Matching Network," the entire contents of which are hereby incorporated into this patent specification.

Our presently preferred embodiment of the coil array 30 employs eight induction coils (i.e., four coil pairs), where each of the eight coils has an inductance of 3.6 $\mu$H. In the designs of FIGS. 9 and 10 in which pairs of induction coils 40*a*, 42 are connected in series and the four pairs are connected in parallel, the total inductance of the coil array connected between the capacitor 90 and the output 35 of the impedance matching network is 1.8 $\mu$H.

Our presently preferred embodiment uses the circuit of FIG. 10 in which the frequency of the RF power supply is 13.56 MHz; the capacitor 90 is 120 pf; the load capacitor 91 is a 450 pf fixed capacitor in parallel with a 30–1300 pf variable capacitor; the tuning capacitor 92 is 90 pf; and the tuning inductor is 0.35–0.70 $\mu$H.

As stated earlier, each induction coil 40*a*, 42 in the preferred embodiment has 3¾ turns of wire. In an earlier prototype, each induction coil had 6 turns of wire. We found that stray capacitance of the coil array in the earlier prototype gave the array a self-resonant frequency of about 14 MHz, almost identical to the 13.56 MHz frequency of the RF power supply 32. Consequently, it was very difficult for any impedance matching network to match the coil array to the power supply output impedance. Reducing the number of turns to the present 3¾ turns raised the self-resonant frequency to about 28 MHz. This experience illustrates that the optimum design will be affected by parasitic inductance and capacitance in the physical layout of the coil array.

Each pair of series-connected coils, (40,42) or (40*a*, 42), optionally may topped by a magnetic shunt (not shown) which magnetically connects the magnetic cores of the two coils of the pair. Such a shunt would be expected to increase somewhat the magnetic flux produced by the coils. However, in our experiments the shunt did not produce any noticeable benefit, so no shunt is included in the preferred embodiment.

As stated earlier, the induction coil array shown in FIGS. 1—3 produces excellent spatial uniformity of the tested semiconductor fabrication process in spite of the gap in the center of the array in which there is no induction coil. Nevertheless, there may be applications in which the spatial uniformity of the process can be improved by adding a coil in the center of the array to alter the magnetic field pattern. FIGS. 11 and 12 show an alternative induction coil array which adds a cylindrical center coil 60 wound around a Teflon dielectric coil form 62 in the shape of a cylinder whose axis is parallel to the axes of the surrounding coils 40,42. A cylindrical ferrite magnetic core 64 preferably occupies a cylindrical cavity in the center of the coil form 62.

The center coil preferably is connected to the same RF power supply 32 which supplies power to the wedge-shaped coils 40, 42. It does not matter whether the center coil 60 is connected in phase with the S coils 40 or in phase with the N coils 42. The magnetic field strength of the center coil can be adjusted to produce a desired magnetic field pattern. Preferably, the field strength of the center coil is empirically adjusted to maximize the spatial uniformity of the magnetic field or to maximize the spatial uniformity of the fabrication process performed on the workpiece. The magnetic field strength can be adjusted by changing the number of turns of wire in the center coil 60, by changing the amount or composition of the ferrous material used in the core around which the coil is wound, or by adjusting the amount of RF power applied to the center coil relative to the other coils.

FIG. 13 shows yet another alternative embodiment of an induction coil array having two concentric arrays of coils. Specifically, in this embodiment, each of the wedge-shaped coils of the FIG. 2 embodiment is divided into a radially inner coil 70 and a radially outer coil 72, with a gap between them. The coils are connected to the first RF power supply with polarities selected so that adjacent coils in any direction will have opposite polarities, as indicated by the S and N symbols in FIG. 13.

The concentric coil embodiment of FIG. 13 affords a greater number of physical parameters that can be adjusted independently to maximize the spatial uniformity of the process being performed on the semiconductor workpiece, or to optimize some other process performance parameter. For example, dimensions which can be adjusted independently include the azimuthal gap between adjacent inner coils 70, the azimuthal gap between adjacent outer coils 72, and the radial gap between an inner coil 70 and its adjacent outer coil 72. Because the interactions among these parameters are complex, the adjustments typically would be optimized empirically.

The concentric coil embodiment of FIG. 13 produces a magnetic field having a cusp pattern whose radial component is comparable in magnitude to its azimuthal component. In contrast, the FIG. 2 embodiment produces a magnetic field having a negligible radial component. This distinction affects the uniformity of the plasma produced in the process chamber, because a radially oriented magnetic field causes azimuthal drift of electrons in the plasma, thereby contributing to azimuthal non uniformity of plasma density. Conversely, an azimuthally oriented magnetic field causes radial drift of electrons in the plasma, thereby contributing to radial non-uniformity of plasma density. The choice between the embodiments of FIGS. 2 and 13 may depend on the need to offset other chamber design and chemical process factors that influence spatial uniformity.

The preferred embodiments discussed above employ an RF power supply 32 which powers the coil array at a frequency of 13.56 MHz. Our theoretical analysis predicts that lowering the RF frequency would increase the current in the coils for a given power level, which would increase the power dissipated as heat due to the resistance of the wires of the induction coils. The increased current also would increase the induced magnetic field, which would increase the power dissipated as heat in the ferrite cores. We tested this theory by changing the power supply frequency from 13 MHz to 2 MHz. Our tests confirmed that the ferrite cores were hotter at 2 MHz than at 13 MHz for the same RF power level being delivered by the power supply.

Our analysis also predicts that lowering the RF frequency would increase the penetration distance of the magnetic field. For a given workpiece mounting position relative to the coil array, increasing the penetration distance generally will increase the process rate and decrease the spatial uniformity of the process, as described earlier.

In the described preferred embodiments, the process gases are excited to a plasma state by a combination of the RF power inductively coupled from the coil array 30 and the RF power capacitively coupled from the cathode electrode 16. Our inventive coil array also can be used to enhance the density of a plasma excited by a plasma source of any other type.

What is claimed is:

1. A plasma chamber for fabricating semiconductors, comprising:

an enclosure for sealing an interior volume so as to withstand a vacuum in said interior;

an RF power supply;

a plurality of induction coils connected to receive electrical power from the RP power supply so that the coils produce a magnetic field in a portion of said interior, wherein each coil has an axial end positioned adjacent a first geometric surface having a circular transverse section, the coils are equally spaced azimuthally relative to said circular transverse section of the first geometric surface, and each coil has a transverse section which is wedge-shaped so that the adjacent sides of any two adjacent coils are approximately parallel to a radius of the circular transverse section of the geometric surface.

2. A plasma chamber according to claim 1, wherein:

the geometric surface is a surface of a circular dielectric wall of the enclosure; and the induction coils are positioned adjacent to and outside of the circular wall.

3. A plasma chamber according to claim 1, wherein:

each coil has a longitudinal axis around which that coil is wound; and the longitudinal axis of each coil is generally perpendicular to the first geometric surface.

4. A plasma chamber according to claim 1, wherein the power supply is connected to supply electrical power to the respective induction coils in respective polarities such that any two adjacent induction coils produce respective magnetic fields of opposite polarity.

5. A plasma chamber according to claim 4, further comprising:
a chuck for holding a semiconductor workpiece at a position in the chamber which is a distance from the induction coils;
wherein the induction coils are spaced apart by an azimuthal gap which is sufficiently small, relative to the distance between the coils and the workpiece position, so that the strength of any magnetic field produced by the coils is at least ten times smaller at the workpiece position than at another position within the plasma chamber which is closer to the coils.

6. A plasma chamber for fabricating semiconductors, comprising:
an enclosure for sealing an interior volume so as to withstand a vacuum in said interior;
a chuck for holding a semiconductor workpiece within said interior at a generally planar, circular workpiece area having a central axis;
an RF power supply;
a plurality of induction coils connected to receive electrical power from the RF power supply so that the coils produce a magnetic field in a portion of said interior, wherein
each respective coil is wound around a respective axis which is generally parallel to said central axis,
the coils are equally spaced azimuthally around said central axis, and
each coil has a transverse section which is wedge-shaped so that, for every two adjacent coils, the respective adjacent sides of said two adjacent coils are approximately parallel to a radius of the circular workpiece area.

7. A plasma chamber according to claim 6, wherein:
each induction coil has an axial end facing the workpiece area; and
the respective axial ends of all the induction coils are positioned in a plane which is parallel to the workpiece area.

8. A plasma chamber according to claim 6, wherein the power supply is connected to supply electrical power to the respective induction coils in respective polarities such that every two adjacent induction coils produce respective magnetic fields of opposite polarity.

9. A plasma chamber according to claim 8, wherein:
each induction coil is positioned at least a distance from the workpiece area; and
the adjacent sides of every two adjacent induction coils are spaced apart by an azimuthal gap which is sufficiently small, relative to said distance, so that the strength of said magnetic field is at least ten times smaller at the workpiece position than at another position within the plasma chamber which is closer to the coils.

10. A plasma chamber for fabricating semiconductors, comprising:
an enclosure for sealing an interior volume so as to withstand a vacuum in said interior;
a plurality of induction coils arranged in a rectangular array, wherein
each coil has a longitudinal axis around which that coil is wound,
the longitudinal axis of each coil is generally perpendicular to a geometric plane,
each coil has an axial end positioned adjacent the geometric plane, and
the coils are spaced apart from each other so that the transverse gap between the respective perimeters of any two adjacent coils equals a first predetermined distance which is substantially identical for any two adjacent coils; and
an RF power supply connected to supply electrical power to the induction coils so that the coils produce a magnetic field in a portion of said interior, the RF power supply being connected to the respective induction coils in respective polarities such that any two adjacent induction coils produce respective magnetic fields of opposite polarity.

11. A chamber according to claim 10, wherein each induction coil has a circular transverse cross section.

12. A chamber according to claim 10, wherein each induction coil has a rectangular transverse cross section, and wherein adjacent sides of adjacent coils are parallel.

13. A chamber according to claim 10, further comprising:
a chuck for holding a semiconductor workpiece parallel to the geometric plane.

14. A chamber according to claim 10, further comprising:
a chuck for holding a semiconductor workpiece at a position in the chamber which is a distance from the induction coils;
wherein the first predetermined distance is sufficiently small, relative to the distance between the coils and the workpiece position, so that the strength of any magnetic field produced by the coils is at least ten times smaller at the workpiece position than at another position within the plasma chamber which is closer to the coils.

15. A plasma chamber for fabricating semiconductors, comprising:
an enclosure for sealing an interior volume so as to withstand a vacuum in said interior;
an RF power supply; and
a number of induction coils mounted adjacent the interior and connected to the power supply, wherein
each coil has first and second ends which are respectively closer to and farther from the interior, and
each coil is connected to the power supply so that the first end of said coil is at a substantially lower RF voltage relative to electrical ground than the second end of said coil.

16. A plasma chamber according to claim 15, wherein:
the RF power supply comprises two outputs which are respectively electrically grounded and ungrounded;
the first end of each coil is connected to electrical ground; and
the second end of each coil is connected to the ungrounded power supply output.

17. A plasma chamber according to claim 15, further comprising:
a capacitor having two terminals, one of the two capacitor terminals being connected to electrical ground, and the other one of the capacitor terminals being ungrounded;
wherein the RF power supply comprises two outputs which are respectively electrically grounded and ungrounded;
wherein the induction coils are connected together in pairs such that each pair consists of two of the induction coils, and such that, for each pair of induction coils
the respective first coil ends of the two coils of the pair are connected together,
the second coil end of a first one of the coils of the pair is connected to the ungrounded terminal of the capacitor, and the second coil end of the other one of the coils of the pair is connected to the ungrounded output of the RF power supply; and wherein the capacitor has a capacitance value which resonates at the frequency of the RF power supply with the inductance which would be provided by connecting in parallel the respective first coils of all the coil pairs.

18. A plasma chamber according to claim 15, further comprising:

a capacitor having two terminals, one of the two capacitor terminals being connected to electrical ground, and the other one of the capacitor terminals being ungrounded;

wherein the RF power supply comprises two outputs which are respectively electrically grounded and ungrounded;

wherein the number of said induction coils is an integer N multiplied by two;

wherein the induction coils are connected together in N pairs such that each pair consists of two of the induction coils, and such that, for each pair of induction coils the respective first coil ends of the two coils of the pair are connected together, the second coil end of a first one of the coils of the pair is connected to the ungrounded terminal of the capacitor, and the second coil end of the other one of the coils of the pair is connected to the ungrounded output of the RF power supply; and wherein the capacitor has a capacitance value approximately equal to the integer N multiplied by the capacitance value which would resonate at the frequency of the RF power supply with the inductance of the first coil of one of the N coil pairs.

19. A plasma chamber according to claim 15, wherein:

the RF power supply comprises two outputs which are balanced relative to electrical ground; and the induction coils are connected together in pairs such that each pair consists of two of the induction coils, and such that, for each pair of induction coils the respective first coil ends of the two coils of the pair are connected together, and the respective second coil ends of the two coils of the pair are connected to the first and second power supply outputs, respectively.

20. A plasma chamber according to claim 15, wherein:

the RF power supply comprises two outputs which are floating relative to electrical ground; and the induction coils are connected together in pairs such that each pair consists of two of the induction coils, and such that, for each pair of induction coils the respective first coil ends of the two coils of the pair are connected together, and the respective second coil ends of the two coils of the pair are connected to the first and second power supply outputs, respectively.

21. A plasma source for inductively coupling electrical power to a plasma in a vacuum chamber, comprising:

a first plurality of induction coils, wherein each coil has an axial end positioned adjacent a first geometric surface having a circular transverse section, the coils are equally spaced azimuthally relative to said circular transverse section of the first geometric surface, and each coil has a transverse section which is wedge-shaped so that the adjacent sides of any two adjacent coils are approximately parallel to a radius of the circular transverse section of the first geometric surface.

22. A plasma source according to claim 21, wherein:

each coil has a longitudinal axis around which that coil is wound; and the longitudinal axis of each coil is generally perpendicular to the first geometric surface.

23. A plasma source according to claim 21, wherein any two adjacent coils produce respective magnetic fields of opposite polarity.

24. A plasma source according to claim 21 further comprising:

an electrical power supply connected to supply electrical power to the respective induction coils in respective polarities such that any two adjacent coils produce respective magnetic fields of opposite polarity.

25. A plasma source according to claim 24, wherein:

for any two adjacent coils, one of said two adjacent coils is wound clockwise, and the other one of said two adjacent coils is wound counterclockwise.

26. A plasma source according to claim 24, wherein:

each of the coils is wound in the same direction; and any two adjacent coils are connected to the power supply in opposite polarities so that electrical current from the power supply flows through said two adjacent coils in opposite directions.

27. A plasma source according to claim 21, wherein each induction coil further comprises a magnetic core having a magnetic permeability substantially greater than one.

28. A plasma source according to claim 21, further comprising:

a center induction coil having an axial end positioned adjacent the center of the first geometric surface, the center coil being surrounded by the first plurality of coils.

29. A plasma source according to claim 21, further comprising:

a second plurality of induction coils, wherein each coil of the second plurality has an axial end positioned adjacent a generally planar, annular surface which is concentric with and encircles the first geometric surface, the coils of the second plurality are equally spaced azimuthally relative to the annular surface, and each coil has a transverse section which is wedge-shaped so that the adjacent sides of any two adjacent coils are approximately parallel to a radius of the annular surface.

30. A plasma source according to claim 29, wherein any two adjacent coils produce respective magnetic fields of opposite polarity.

31. A plasma chamber according to claim 1, further comprising:

a chuck for holding a semiconductor workpiece parallel to the geometric surface.

32. A plasma chamber according to claim 5, wherein the chuck holds the semiconductor workpiece parallel to the geometric surface.

33. A plasma chamber according to claim 4, wherein:

for any two adjacent coils, one of said two adjacent coils is wound clockwise, and the other one of said two adjacent coils is wound counterclockwise.

34. A plasma chamber according to claim 14, wherein:

each of the coils is wound in the same direction; and any two adjacent coils are connected to the power supply in opposite polarities so that electrical current from the power supply flows through said two adjacent coils in opposite directions.

35. A plasma chamber according to claim 1, wherein each induction coil further comprises a magnetic core having a magnetic permeability substantially greater than one.

36. A plasma chamber according to claim 1, further comprising:

a center induction coil connected to the power supply and having an axial end positioned adjacent the center of the geometric surface, the center coil being surrounded by the first plurality of coils.

37. A plasma chamber according to claim 1, further comprising:

a second plurality of induction coils, wherein each coil of the second plurality has an axial end positioned adjacent a generally planar, annular surface which is concentric with and encircles the first geometric surface, the coils of the second plurality are equally spaced azimuthally relative to the annular surface, and each coil has a transverse section which is wedge-shaped so that the adjacent sides of any two adjacent coils are approximately parallel to a radius of the annular surface.

38. A plasma chamber according to claim 37, wherein any two adjacent induction coils produce respective magnetic fields of opposite polarity.

39. A plasma chamber according to claim 26, wherein:

for every two adjacent coils, one of said two adjacent coils is wound clockwise, and the other one of said two adjacent coils is wound counterclockwise.

40. A plasma chamber according to claim 26, wherein:

each of the coils is wound in the same direction; and every two adjacent coils are connected to the power supply in opposite polarities so that electrical current from the power supply flows through the respective two adjacent coils in opposite directions.

41. A plasma chamber according to claim 24, wherein each induction coil further comprises a magnetic core having a magnetic permeability substantially greater than one.

42. A plasma chamber according to claim 24, further comprising:

a center induction coil which is connected to the power supply and which is wound around an axis coincident with said central axis.

* * * * *

UNITED STATES PATENT AND TRADEMARK OFFICE
CERTIFICATE OF CORRECTION

PATENT NO.    : 6,273,022 B1
DATED         : August 14, 2001
INVENTOR(S)   : Pu et al.

It is certified that error appears in the above-identified patent and that said Letters Patent is hereby corrected as shown below:

Column 20,
Line 66, change "14" to -- 4 --

Column 22,
Line 4, change "26" to -- 8 --
Line 9, change "26" to -- 8 --
Line 16, change "24" to -- 6 --
Line 20, change "24" to -- 6 --
Line 25, Insert the following claims 43–52:

43. A chamber according to claim 14, wherein the chuck holds the semiconductor workpiece parallel to the geometric plane.

44. A plasma source according to claim 14, wherein:
　　for any two adjacent coils, one of said two adjacent coils is wound clockwise, and the other one of said two adjacent coils is wound counterclockwise.

45. A plasma source according to claim 14, wherein:
　　each of the coils is wound in the same direction; and
　　any two adjacent coils are connected to the RF power supply in opposite polarities so that electrical current from the RF power supply flows through said two adjacent coils in opposite directions.

46. A plasma chamber according to claim 10, wherein each induction coil further comprises a magnetic core having a magnetic permeability substantially greater than one.

47. A plasma chamber for fabricating semiconductors, comprising:
　　an enclosure for sealing an interior volume so as to withstand a vacuum in said interior;
　　an RF power supply; and
　　a number of induction coils connected to the power supply and mounted adjacent a region of the interior so as to couple electromagnetic power to a plasma within said region, wherein
　　　　each coil has first and second ends which are respectively closer to and farther from said region, and
　　　　each coil is connected to the power supply so that the first end of said coil is at a substantially lower RF voltage relative to electrical ground than the second end of said coil.

48. A plasma chamber for fabricating semiconductors, comprising:
　　an enclosure for sealing an interior volume so as to withstand a vacuum in said interior;
　　an RF power supply having two outputs which are respectively electrically grounded and ungrounded; and
　　a number of induction coils connected to the power supply and mounted adjacent a region of the interior so as to couple electromagnetic power to a plasma within said region, wherein
　　　　each coil has first and second ends which are respectively closer to and farther from said region,
　　　　the first coil end is connected to electrical ground, and
　　　　the second coil end is connected to the ungrounded power supply output.

49. A plasma chamber for fabricating semiconductors, comprising:
　　an enclosure for sealing an interior volume so as to withstand a vacuum in said interior;
　　an RF power supply having two outputs, one of the outputs being connected to electrical ground, and the other one of the outputs being ungrounded;
　　a capacitor having two terminals, one of the capacitor terminals being connected to electrical ground, and the other one of the capacitor terminals being ungrounded; and

UNITED STATES PATENT AND TRADEMARK OFFICE
CERTIFICATE OF CORRECTION

PATENT NO. : 6,273,022 B1
DATED : August 14, 2001
INVENTOR(S) : Pu et al.

It is certified that error appears in the above-identified patent and that said Letters Patent is hereby corrected as shown below:

Column 22 cont'd, a number of induction coils connected to the power supply and mounted adjacent a region of the interior so as to couple electromagnetic power to a plasma within said region;
      wherein the induction coils are connected together in pairs such that each pair consists of two of the induction coils, and such that, for each pair of induction coils
          the respective first coil ends of the two coils of the pair are connected together,
          the second coil end of a first one of the coils of the pair is connected to the ungrounded terminal of the capacitor, and
          the second coil end of the other one of the coils of the pair is connected to the ungrounded output of the RF power supply; and
      wherein the capacitor has a capacitance value which resonates at the frequency of the RF power supply with the inductance which would be provided by connecting in parallel the respective first coils of all the coil pairs.

50. A plasma chamber for fabricating semiconductors, comprising:
      an enclosure for sealing an interior volume so as to withstand a vacuum in said interior;
      an RF power supply having two outputs, one of the outputs being connected to electrical ground, and the other one of the outputs being ungrounded;
      a capacitor having two terminals, one of the capacitor terminals being connected to electrical ground, and the other one of the capacitor terminals being ungrounded; and
      a number of induction coils connected to the power supply and mounted adjacent a region of the interior so as to couple electromagnetic power to a plasma within said region;
      wherein the number of said induction coils is an integer N multiplied by two;
      wherein the induction coils are connected together in N pairs such that each pair consists of two of the induction coils, and such that, for each pair of induction coils
          the respective first coil ends of the two coils of the pair are connected together,
          the second coil end of a first one of the coils of the pair is connected to the ungrounded terminal of the capacitor, and

UNITED STATES PATENT AND TRADEMARK OFFICE
CERTIFICATE OF CORRECTION

PATENT NO. : 6,273,022 B1
DATED : August 14, 2001
INVENTOR(S) : Pu et al.

It is certified that error appears in the above-identified patent and that said Letters Patent is hereby corrected as shown below:

<u>Column 22 cont'd,</u>
the second coil end of the other one of the coils of the pair is connected to the ungrounded output of the RF power supply; and
wherein the capacitor has a capacitance value approximately equal to the integer N multiplied by the capacitance value which would resonate at the frequency of th RF power supply with the inductance of the first coil of one of the N coil pairs.

51. A plasma chamber for fabricating semiconductors, comprising:
an enclosure for sealing an interior volume so as to withstand a vacuum in said interior;
an RF power supply having first and second outputs which are balanced with respect to electrical ground; and
a number of pairs of induction coils connected to the power supply and mounted adjacent a region of the interior so as to couple electromagnetic power to a plasma within said region;
wherein each pair includes two induction coils, each coil of the pair having first and second ends which are respectively closer to and farther from the plasma region, the respective first coil ends of the two coils of the pair being connected together, and the respective second coil ends of the two coils of the pair being connected to the first and second power supply outputs, respectively.

52. A plasma chamber for fabricating semiconductors, comprising:
an enclosure for sealing an interior volume so as to withstand a vacuum in said interior;
an RF power supply having first and second outputs which are floating with respect to electrical ground; and
a number of pairs of induction coils connected to the power supply and mounted adjacent a region of the interior so as to couple electromagnetic power to a plasma within said region;
wherein each pair includes two induction coils, each coil of the pair having first and second ends which are respectively closer to and farther from the plasma region, the respective first coil ends of the two coils of the pair being connected together, and the respective second coil ends of the two coils of the pair being connected to the first and second power supply outputs, respectively.

Signed and Sealed this

Twentieth Day of May, 2003

JAMES E. ROGAN
*Director of the United States Patent and Trademark Office*